(12) United States Patent
Yi et al.

(10) Patent No.: US 8,736,011 B2
(45) Date of Patent: May 27, 2014

(54) LOW THERMAL CONDUCTIVITY MATRICES WITH EMBEDDED NANOSTRUCTURES AND METHODS THEREOF

(75) Inventors: Mingqiang Yi, San Pablo, CA (US); Gabriel A. Matus, San Francisco, CA (US); Matthew L. Scullin, San Francisco, CA (US); Chii Guang Lee, Fremont, CA (US); Sylvain Muckenhirn, Santa Barbara, CA (US)

(73) Assignee: Alphabet Energy, Inc., Hayward, CA (US)

( * ) Notice: Subject to any disclaimer, the term of this patent is extended or adjusted under 35 U.S.C. 154(b) by 48 days.

(21) Appl. No.: 13/308,945

(22) Filed: Dec. 1, 2011

(65) Prior Publication Data

US 2012/0319082 A1 Dec. 20, 2012

Related U.S. Application Data

(60) Provisional application No. 61/419,366, filed on Dec. 3, 2010.

(51) Int. Cl.
*H01L 31/058* (2006.01)
(52) U.S. Cl.
USPC .......................................... 257/467; 977/762
(58) Field of Classification Search
USPC .................................. 257/467, 712; 977/762
See application file for complete search history.

(56) References Cited

U.S. PATENT DOCUMENTS

| | | | |
|---|---|---|---|
| 4,251,286 A | 2/1981 | Barnett | |
| 5,391,914 A | 2/1995 | Sullivan et al. | |
| 5,824,561 A | 10/1998 | Kishi et al. | |
| 5,837,929 A | 11/1998 | Adelman | |
| 6,843,902 B1 | 1/2005 | Penner et al. | |
| 6,882,051 B2 | 4/2005 | Majumdar et al. | |
| 6,894,215 B2 | 5/2005 | Akiba | |

(Continued)

FOREIGN PATENT DOCUMENTS

CN 101009214 A 8/2007
JP 2004-532133 10/2004
(Continued)

OTHER PUBLICATIONS

Electron Microscopy Sciences, Colloidal Compounds and Conductive Adhesives, Jan. 25, 2011; Retrieved on Aug. 13, 2012 from the Internet <URL: http://web.archive.org/web/20110125172854/http://emsdiasum.com/microscopy/products/scm/colloidal.aspx>. pp. 1-16.

(Continued)

*Primary Examiner* — Mark Prenty
(74) *Attorney, Agent, or Firm* — Jones Day

(57) ABSTRACT

A matrix with at least one embedded array of nanowires and method thereof. The matrix includes nanowires and one or more fill materials located between the nanowires. Each of the nanowires including a first end and a second end. The nanowires are substantially parallel to each other and are fixed in position relative to each other by the one or more fill materials. Each of the one or more fill materials is associated with a thermal conductivity less than 50 Watts per meter per degree Kelvin. And, the matrix is associated with at least a sublimation temperature and a melting temperature, the sublimation temperature and the melting temperature each being above 350° C.

41 Claims, 13 Drawing Sheets

(56) References Cited

U.S. PATENT DOCUMENTS

| | | | |
|---|---|---|---|
| 6,996,147 | B2 | 2/2006 | Majumdar et al. |
| 7,605,327 | B2 | 10/2009 | Roscheisen et al. |
| 2002/0175408 | A1 | 11/2002 | Majumdar et al. |
| 2003/0041892 | A1 | 3/2003 | Fleurial et al. |
| 2003/0099279 | A1 | 5/2003 | Venkatasubramanian et al. |
| 2003/0184188 | A1 | 10/2003 | Kucherov et al. |
| 2003/0189202 | A1 | 10/2003 | Li et al. |
| 2004/0000333 | A1 | 1/2004 | Chen et al. |
| 2004/0042181 | A1 | 3/2004 | Nagasaki |
| 2004/0157354 | A1 | 8/2004 | Kuriyama et al. |
| 2005/0045702 | A1 | 3/2005 | Freeman et al. |
| 2005/0064185 | A1 | 3/2005 | Buretea et al. |
| 2005/0241690 | A1 | 11/2005 | Tajima et al. |
| 2006/0000502 | A1 | 1/2006 | Fiorini et al. |
| 2006/0076046 | A1 | 4/2006 | Ghoshal et al. |
| 2006/0118158 | A1 | 6/2006 | Zhang et al. |
| 2006/0151820 | A1 | 7/2006 | Duan et al. |
| 2006/0157101 | A1 | 7/2006 | Sakamoto et al. |
| 2006/0172116 | A1 | 8/2006 | Den et al. |
| 2006/0233692 | A1 | 10/2006 | Scaringe et al. |
| 2006/0266402 | A1 | 11/2006 | Zhang et al. |
| 2007/0025658 | A1 | 2/2007 | Fukai et al. |
| 2007/0128773 | A1 | 6/2007 | Baskaran |
| 2007/0131269 | A1 | 6/2007 | Dutta |
| 2007/0132043 | A1 | 6/2007 | Bradley et al. |
| 2007/0261730 | A1 | 11/2007 | Seker et al. |
| 2008/0006843 | A1 | 1/2008 | Dai et al. |
| 2008/0121263 | A1 | 5/2008 | Schutte et al. |
| 2008/0142066 | A1 | 6/2008 | Plissonnier et al. |
| 2008/0149914 | A1 | 6/2008 | Samelson et al. |
| 2008/0173344 | A1 | 7/2008 | Zhang et al. |
| 2008/0178920 | A1 | 7/2008 | Ullo |
| 2008/0178921 | A1 | 7/2008 | Ye |
| 2008/0268233 | A1 | 10/2008 | Lawin et al. |
| 2008/0299381 | A1 | 12/2008 | Zhang et al. |
| 2009/0020148 | A1 | 1/2009 | Boukai et al. |
| 2009/0096109 | A1 | 4/2009 | Iwasaki |
| 2009/0117741 | A1 | 5/2009 | Heath et al. |
| 2009/0140145 | A1 | 6/2009 | Ouvrier-Buffet et al. |
| 2009/0174038 | A1 | 7/2009 | Wang |
| 2009/0236317 | A1 | 9/2009 | Yost et al. |
| 2010/0068871 | A1 | 3/2010 | Tian et al. |
| 2010/0147371 | A1 | 6/2010 | Cho |
| 2010/0162728 | A1 | 7/2010 | Lee |
| 2010/0233518 | A1 | 9/2010 | Kwon et al. |
| 2010/0236596 | A1 | 9/2010 | Lee et al. |
| 2010/0261013 | A1 | 10/2010 | Duan et al. |
| 2010/0272993 | A1 | 10/2010 | Volinsky et al. |
| 2011/0000708 | A1 | 1/2011 | Nakai et al. |
| 2011/0059568 | A1 | 3/2011 | Chao et al. |
| 2011/0114146 | A1 | 5/2011 | Scullin |
| 2012/0152295 | A1 | 6/2012 | Matus et al. |
| 2012/0247527 | A1 | 10/2012 | Scullin et al. |
| 2012/0295074 | A1* | 11/2012 | Yi et al. .................. 428/195.1 |
| 2013/0175654 | A1 | 7/2013 | Muckenhirn et al. |
| 2013/0187130 | A1 | 7/2013 | Matus et al. |
| 2014/0024163 | A1 | 1/2014 | Aguirre et al. |

FOREIGN PATENT DOCUMENTS

| | | |
|---|---|---|
| JP | 2006-332188 | 12/2006 |
| RU | 2296055 | 11/2006 |
| WO | WO 02/080280 | 10/2002 |
| WO | WO 2006/062582 | 6/2006 |
| WO | WO 2009/026466 | 2/2009 |
| WO | WO 2010/004550 | 1/2010 |
| WO | WO 2010/018893 | 2/2010 |

OTHER PUBLICATIONS

Peng et al., "Aligned Single-Crystalline Si Nanowire Arrays for Photovoltaic Applications," Small, 1(11), (2005), pp. 1062-1067.

Tang et al., "Holey Silicon as an Efficient Thermoelectric Material," Nano Lett., 10 (2010), pp. 4279-4283.

Wang et al., "Complementary Symmetry Silicon Nanowire Logic: Power-Efficient Inverters with Gain," Small, 2(10), (2006), pp. 1153-1158.

Patent Cooperation Treaty, International Search Report for related application PCT/US2011/061301, mailed Jan. 31, 2013.

Patent Cooperation Treaty, Written Opinion of the International Searching Authority for related application PCT/US2011/061301, mailed Jan. 31, 2013.

Patent Cooperation Treaty, International Search Report for related application PCT/US2012/023425, mailed Sep. 4, 2012.

Patent Cooperation Treaty, Written Opinion of the International Searching Authority for related application PCT/US2012/023425, mailed Sep. 4, 2012.

Patent Cooperation Treaty, International Search Report for related application PCT/US2013/025060, mailed Apr. 15, 2013.

Patent Cooperation Treaty, Written Opinion of the International Searching Authority for related application PCT/US2013/025060, mailed Apr. 15, 2013.

Chartier et al., "Metal-Assisted Chemical Etching of Silcon in $HF-H_2O_2$," Electrochmica Acta, 53 (2008) pp. 5509-5516.

Chen et al., "Vertically-Aligned of Sub-Millimeter Ultralong Si Nanowire Arrays and Its Reduced Phonon Thermal Conductivity," Journal of The Electrochemical Society, 158:5 (2011) pp. D302-D306.

Chen et al., "Thermal Conductance of Thin Silicon Nanowires," Physical Review Letters, 101 (2008) pp. 105501-1-105501-4.

Douani et al., "Formation of a-SI:H and $a-Si_{1-x}C_x$:H Nanowires by Ag-Assisted Electroless Etching in Aqueous $HF/AgNO_3$ Solution," Thin Solid Films, 519 (2011) pp. 5383-5387.

Evanoff et al., "Synthesis and Optical Properties of Silver Nanoparticles and Arrays," ChemPhysChem, 6 (2005) pp. 1221-1231.

Fang et al., "Silver Catalysis in the Fabrication of Silicon Nanowire Arrays," Nanotechnology, 17 (2006) pp. 3768-3774.

Gao et al., "Selective Growth of Si Nanowire Arrays via Galvanic Displacement Processes in Water-in-Oil Microemulsions," J. Am. Chem. Soc., 127 (2005) pp. 4574-4575.

Gielis et al., "Silver-Assisted Electroless Etching of Si Nanowires," Abstract #1971, presented Oct. 11, 2010 at the $218^{th}$ ECS Meeting (held in Las Vegas, NV, Oct. 10-15, 2010).

Heitsch et al., J. Am. Chem. Soc., 130 (2008) pp. 5436-5437.

Hochbaum et al., "Controlled Growth of Si Nanowire Arrays for Device Integration," Nano Letters, 5(3) (2005) pp. 457-460.

Hochbaum et al., "Enhanced Thermoelectric Performance of Rough Silicon Nanowires," Nature, 451 (2008) pp. 163-167 (with full Methods attached from on-line version of this paper at www.nature.com/nature).

Hochbaum et al., "Single Crystalline Mesoporous Silicon Nanowires," Nano Letters, 9(10) (2009) pp. 3550-3554.

Morinaga et al., "Mechanism of Metallic Particle Growth and Metal-Induced Pitting on Si Wafer Surface in Wet Chemical Process," J. Electrochem. Soc., 141(10) (1994) pp. 2834-2841.

Nahm et al., "Mechanism of Silicon Etching in $HF-KMnO_4-H_2O$ Solution," Korean J. of Chem. Eng., 12(2) (1995) pp. 162-167.

Parkhutik, V.P., "Oscillations of Open-Circuit Potential During Immersion Plating of Silicon in $CuSO_4/HF$ Solutions," Russian Journal of Electrochemistry, 42(5) (2006) pp. 512-522.

Peng et al., "Dendrite-Assisted Growth of Silicon Nanowires in Electroless Metal Deposition," Advanced Functional Materials, 13(2) (2003) pp. 127-132.

Peng et al., "Motility of Metal Nanoparticles in Silicon and Induced Anisotropic Silicon Etching," Advanced Functional Materials, 18 (2008) pp. 3026-3035.

Peng et al., "Synthesis of Large-Area Silicon Nanowire Arrays via Self-Assembling Nanoelectrochemistry," Adv. Mater., 14(16) (2002) pp. 1164-1167.

Peng et al., "Uniform, Axial-Orientation Alignment of One-Dimensional Single-Crystal Silicon Nanostructure Arrays," Angew. Chem. Int. Ed., 44 (2005) pp. 2737-2742.

Rokugawa et al., "An Etchant System, $Ag_2CrO_4-HF-H_2O$, for Highly Aligned Si Nanowire Fabrication," Journal of the Electrochemical Society, 157(8) (2010) pp. K157-K161.

(56) References Cited

OTHER PUBLICATIONS

Rutten et al., "The Electrochemical Reduction of Nitrate in Acidic Nitrate Solutions," *Journal of Applied Electrochemistry*, 29 (1999) pp. 87-92.
Sivakov et al., "Realization of Vertical and Zigzag Single Crystalline Silicon Nanowire Architectures," *J. Phys. Chem. C*, 114 (2010) pp. 3798-3803.
Weiss et al., "Nanoparticle-Textured Surfaces from Spin Coating," *Langmuire*, 24 (2008) pp. 5218-5220.
Zandi et al., "Study of Bulk Micromachining for <100> Silicon," *Eur. Phys. J. Appl. Phys.*, 35 (2006) pp. 7-12.
Patent Cooperation Treaty, International Search Report for related application PCT/US2010/056356, mailed Jun. 3, 2011.
Patent Cooperation Treaty, Written Opinion of the International Searching Authority for related application PCT/US2010/056356, mailed Jun. 3, 2011.
Patent Cooperation Treaty, International Search Report for corresponding application PCT/US2011/63000, mailed Apr. 3, 2012.
Patent Cooperation Treaty, Written Opinion of the International Searching Authority for corresponding application PCT/US2011/63000, mailed Apr. 3, 2012.
Patent Cooperation Treaty, International Search Report for related application PCT/US2011/066108, mailed Apr. 26, 2012.
Patent Cooperation Treaty, Written Opinion of the International Searching Authority for related application PCT/US2011/066108, mailed Apr. 26, 2012.
Asheghi et al., "Phonon-Boundary Scattering in Thin Silicon Layers," *Appl. Phys. Lett.*, 71(13) (1997), pp. 1798-1800.
Asheghi et al., "Temperature-Dependent Thermal Conductivity of Single Crystal Silicon Layers in SOI Substrates," *J. Heat Transf.*, 120 (1998), pp. 30-36.
Brinson et al., "Thermal Conductivity and Thermoelectric Power of Heavily Doped N-Type Silicon," *J. Phys. C*, 3 (1970), pp. 483-491.
Cahill et al., "Thermal Conductivity of Amorphous Solids Above the Plateau," *Phys. Rev. B*, 35 (1987) pp. 4067-4073.
Disalvo, Francis J., "Thermoelectric Cooling and Power Generation," *Science*, 285 (1999), pp. 703-706.
Geballe et al., "Seebeck Effect in Silicon," *Phys. Rev.*, 98(4) (1955), pp. 940-947.
Harman et al., "Quantum Dot Superlattice Thermoelectric Materials and Evices," *Science*, 297 (2002), pp. 2229-2232.
Hsu et al., "Cubic $AgPb_mSbTe_{2+m}$: Bulk Thermoelectric Materials with High Figure of Merit," *Science*, 303 (2004), pp. 818-821.
Ju et al., "Phonon Scattering in Silicon Films with Thickness of Order 100 nm," *Appl. Phys. Lett.*, 74(20) (1999), pp. 3005-3007.
Kim et al., "Thermal Conductivity Reduction and Thermoelectric Figure of Merit Increase by Embedding Nanoparticles in Crystalline Semiconductors," *Phys. Rev. Lett.*, 96 (2006), pp. 045901-1-045901-4.
Li et al., "Thermal Conductivity of Individual Silicon Nanowires," *Appl. Phys. Lett.*, 83(14) (2003), pp. 2934-2936.
Majumdar, A., "Thermoelectricity in Semiconductor Nanostructures," *Science*, 303 (2004), pp. 777-778.
Peng et al., "Aligned Single-Crystalline Si Nanowire Arrays for Photovoltaic Applications," *Small*, 1(11), (2005), pp. 1062-1067, with an additional three pages of "Supporting Information."
Ruf et al., "Thermal Conductivity of Isotopically Enriched Silicon," *Solid State Commun.*, 115 (2000), pp. 243-247.
Shi et al., "Measuring Termal and Thermoelectric Properties of One-Dimensional Nanostructures Using a Microfabricated Device," *J. Heat Transf.*, 125 (2003), pp. 881-888.
Tao et al., "Langmuir-Blodgett Silver Nanowire Monolayers for Molecular Sensing Using Surface-Enhanced Raman Spectroscopy," *Nano. Lett.*, 3 (2003), pp. 1229-1233.

Van Herwaarden, A.W., "The Seebeck Effect in Silicon ICs.," *Sensors and Actuators*, 6 (1984), pp. 245-254.
Venkatasubramanian et al., "Thin-film Thermoelectric Devices with High Room-Temperature Figures of Merit," *Nature*, 413 (2001), pp. 597-602.
Weber et al., "Transport Properties of Silicon," *Appl. Phys. A.* 53 (1991), pp. 136-140.
Zhang et al., "Synthesis of Ordered Single Crystal Silicon Nanowire Arrays," *Adv. Mater.*, 13(16) (2001), pp. 1238-1241.
Zou et al., "Phonon Heat Conduction in a Semiconductor Nanowire," *J. App. Phys.*, 89(5) (2001) pp. 2932-2938.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
Chinese Patent Office, Office Action in CN Application No. 200880113050.3, mailed Mar. 5, 2013.
Chinese Patent Office, Office Action in CN Application No. 200880113050.3, mailed Aug. 26, 2013.
European Patent Office, Supplemental Search Report for EP Application No. 08827590.4, completed Jul. 26, 2013, mailed Aug. 5, 2013.
European Patent Office, Supplemental Search Report for EP Application No. 10163141.4, mailed Aug. 20, 2013.
Japanese Patent Office, Office Action in JP Application No. 2010-522040, mailed Mar. 5, 2013.
Japanese Patent Office, Office Action in JP Application No. 2010-522040, mailed Oct. 15, 2013.
Patent Cooperation Treaty, International Search Report for PCT/US2008/73922, mailed Dec. 23, 2008.
Patent Cooperation Treaty, Written Opinion for PCT/US2008/73922, mailed Dec. 23, 2008.
Russian Patent Office, Office Action in RU Application No. 2010110307/04, mailed Jun. 1, 2012.
Russian Patent Office, Resolution on Granting Patent for Invention for RU Application No. 2010110307/04, mailed Sep. 11, 2013.
United States Patent and Trademark Office, Office Action issued in U.S. Appl. No. 12/673,366, mailed May 1, 2013.
United States Patent and Trademark Office, Office Action issued in U.S. Appl. No. 12/673,366, mailed Sep. 26, 2013.
United States Patent and Trademark Office, Advisory Action issued in U.S. Appl. No. 12/673,366, mailed Nov. 27, 2013.
United States Patent and Trademark Office, Office Action issued in U.S. Appl. No. 12/943,134, mailed Nov. 18, 2013.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.
United States Patent and Trademark Office, Office Action issued in U.S. Appl. No. 13/364,176, mailed Jan. 27, 2014.
United States Patent and Trademark Office, Office Action issued in U.S. Appl. No. 13/760,977, mailed Apr. 1, 2014.
Wilson, "Thermal Conductivity of Solders," Electronics-cooling.com [retrieved online on Jan. 23, 2014], from the Internet <URL: http://www.electronics-cooling.com/2006/08/thermal-conductivity-of-solders/>, pp. 1-3.
YOO et al., "Thermal Conductivity of Al2O3/Water Nanofluids," *Journal of the Korean Physical Society*, 51 (Oct. 2007), pp. S84-S87.

\* cited by examiner

US 8,736,011 B2

LOW THERMAL CONDUCTIVITY MATRICES WITH EMBEDDED NANOSTRUCTURES AND METHODS THEREOF

CROSS-REFERENCES TO RELATED APPLICATIONS

This application claims priority to U.S. Provisional Application No. 61/419,366, filed Dec. 3, 2010, commonly assigned and incorporated by reference herein for all purposes.

Additionally, this application is related to U.S. patent application Ser. No. 13/299,179, which is incorporated by reference herein for all purposes.

STATEMENT AS TO RIGHTS TO INVENTIONS MADE UNDER FEDERALLY SPONSORED RESEARCH OR DEVELOPMENT

This invention was made with government support under SBIR Contract No. FA8650-10-M-2031 awarded by the U.S. Air Force. The government has certain rights in the invention.

BACKGROUND OF THE INVENTION

The present invention is directed to nanostructures. More particularly, the invention provides low thermal conductivity matrices with embedded nanostructures and methods thereof. Merely by way of example, the invention has been applied to arrays of nanostructures embedded in one or more low thermal conductivity materials for use in thermoelectric devices. However, it would be recognized that the invention has a much broader range of applicability, including but not limited to use in solar power, battery electrodes and/or energy storage, catalysis, and/or light emitting diodes.

Thermoelectric materials are ones that, in the solid state and with no moving parts, can, for example, convert an appreciable amount of thermal energy into electricity in an applied temperature gradient (e.g., the Seebeck effect) or pump heat in an applied electric field (e.g., the Peltier effect). The applications for solid-state heat engines are numerous, including the generation of electricity from various heat sources whether primary or waste, as well as the cooling of spaces or objects such as microchips and sensors. Interest in the use of thermoelectric devices that comprise thermoelectric materials has grown in recent years in part due to advances in nano-structured materials with enhanced thermoelectric performance (e.g., efficiency, power density, or "thermoelectric figure of merit" ZT, where ZT is equal to $S^2\sigma/k$ and S is the Seebeck coefficient, $\sigma$ the electrical conductivity, and k the thermal conductivity of the thermoelectric material) and also due to the heightened need both for systems that either recover waste heat as electricity to improve energy efficiency or cool integrated circuits to improve their performance.

To date, thermoelectrics have had limited commercial applicability due to the poor cost performance of these devices compared to other technologies that accomplish similar means of energy generation or refrigeration. Where other technologies usually are not as suitable as thermoelectrics for use in lightweight and low footprint applications, thermoelectrics often have nonetheless been limited by their prohibitively high costs. Important in realizing the usefulness of thermoelectrics in commercial applications is the manufacturability of devices that comprise high-performance thermoelectric materials (e.g., modules). These modules are preferably produced in such a way that ensures, for example, maximum performance at minimum cost.

The thermoelectric materials in presently available commercial thermoelectric modules are generally comprised of bismuth telluride or lead telluride, which are both toxic, difficult to manufacture with, and expensive to procure and process. With a strong present need for both alternative energy production and microscale cooling capabilities, the driving force for highly manufacturable, low cost, high performance thermoelectrics is growing.

Thermoelectric devices are often divided into thermoelectric legs made by conventional thermoelectric materials such as $Bi_2Te_3$ and PbTe, contacted electrically, and assembled in a refrigeration (e.g., Peltier) or energy conversion (e.g., Seebeck) device. This often involves bonding the thermoelectric legs to metal contacts in a configuration that allows a series-configured electrical connection while providing a thermally parallel configuration, so as to establish a temperature gradient across all the legs simultaneously. However, many drawbacks may exist in the production of conventional thermoelectric devices. For example, costs associated with processing and assembling the thermoelectric legs made externally is often high. The conventional processing or assembling method usually makes it difficult to manufacture compact thermoelectric devices needed for many thermoelectric applications. Conventional thermoelectric materials are usually toxic and expensive.

Nanostructures often refer to structures that have at least one structural dimension measured on the nanoscale (e.g., between 0.1 nm and 1000 nm). For example, a nanowire is characterized as having a cross-sectional area that has a distance across that is measured on the nanoscale, even though the nanowire may be considerably longer in length. In another example, a nanotube, or hollow nanowire, is characterized by having a wall thickness and total cross-sectional area that has a distance across that is measured on the nanoscale, even though the nanotube may be considerably longer in length. In yet another example, a nanohole is characterized as a void having a cross-sectional area that has a distance across that is measured on the nanoscale, even though the nanohole may be considerably longer in depth. In yet another example, a nanomesh is an array, sometimes interlinked, including a plurality of other nanostructures such as nanowires, nanotubes, and/or nanoholes.

Nanostructures have shown promise for improving thermoelectric performance. The creation of 0D, 1D, or 2D nanostructures from a thermoelectric material may improve the thermoelectric power generation or cooling efficiency of that material in some instances, and sometimes very significantly (a factor of 100 or greater) in other instances. However, many limitations exist in terms of alignment, scale, and mechanical strength for the nanostructures needed in an actual macroscopic thermoelectric device comprising many nanostructures. Processing such nanostructures using methods that are similar to the processing of silicon would have tremendous cost advantages. For example, creating nanostructure arrays with planar surfaces supports planar semiconductor processes like metallization.

Hence, it is highly desirable to form these arrays of nanostructures from materials with advantageous electrical, thermal, and mechanical properties for use in thermoelectric devices.

BRIEF SUMMARY OF THE INVENTION

The present invention is directed to nanostructures. More particularly, the invention provides low thermal conductivity matrices with embedded nanostructures and methods thereof. Merely by way of example, the invention has been applied to arrays of nanostructures embedded in one or more low thermal conductivity materials for use in thermoelectric devices. However, it would be recognized that the invention has a much broader range of applicability, including but not limited to use in solar power, battery electrodes and/or energy storage, catalysis, and/or light emitting diodes.

According to one embodiment, a matrix with at least one embedded array of nanowires includes nanowires and one or more fill materials located between the nanowires. Each of the nanowires including a first end and a second end. The nanowires are substantially parallel to each other and are fixed in position relative to each other by the one or more fill materials. Each of the one or more fill materials is associated with a thermal conductivity less than 50 Watts per meter per degree Kelvin. And, the matrix is associated with at least a sublimation temperature and a melting temperature, the sublimation temperature and the melting temperature each being above 350° C.

According to another embodiment, a matrix with at least one embedded array of nanostructures includes nanostructures, the nanostructures include first ends and second ends respectively. The nanostructures corresponding to voids. One or more fill materials located at least within the voids. Each of the nanostructures includes a semiconductor material. The nanostructures are substantially parallel to each other and are fixed in position relative to each other by the one or more fill materials. Each of the one or more fill materials is associated with a thermal conductivity less than 50 Watts per meter per degree Kelvin. And, the matrix is associated with at least a sublimation temperature and a melting temperature, the sublimation temperature and the melting temperature each being above 350° C.

According to yet another embodiment, a method for making a matrix with at least one embedded array of nanostructures includes filling voids corresponding to nanostructures with at least one or more fill materials, each of the one or more fill materials being associated with a thermal conductivity less than 50 Watts per meter per degree Kelvin, the nanostructures including a semiconductor material and forming a matrix embedded with at least the nanostructures, the matrix being associated with at least a sublimation temperature and a melting temperature, the sublimation temperature and the melting temperature each being above 350° C. The process for filling the voids includes keeping the nanostructures substantially parallel to each other and fixing the nanostructures in position relative to each other by the one or more fill materials.

Depending upon the embodiment, one or more of these benefits may be achieved. These benefits and various additional objects, features, and advantages of the present invention can be fully appreciated with reference to the detailed description and accompanying drawings that follow.

DETAILED DESCRIPTION OF THE INVENTION

Figure 1:
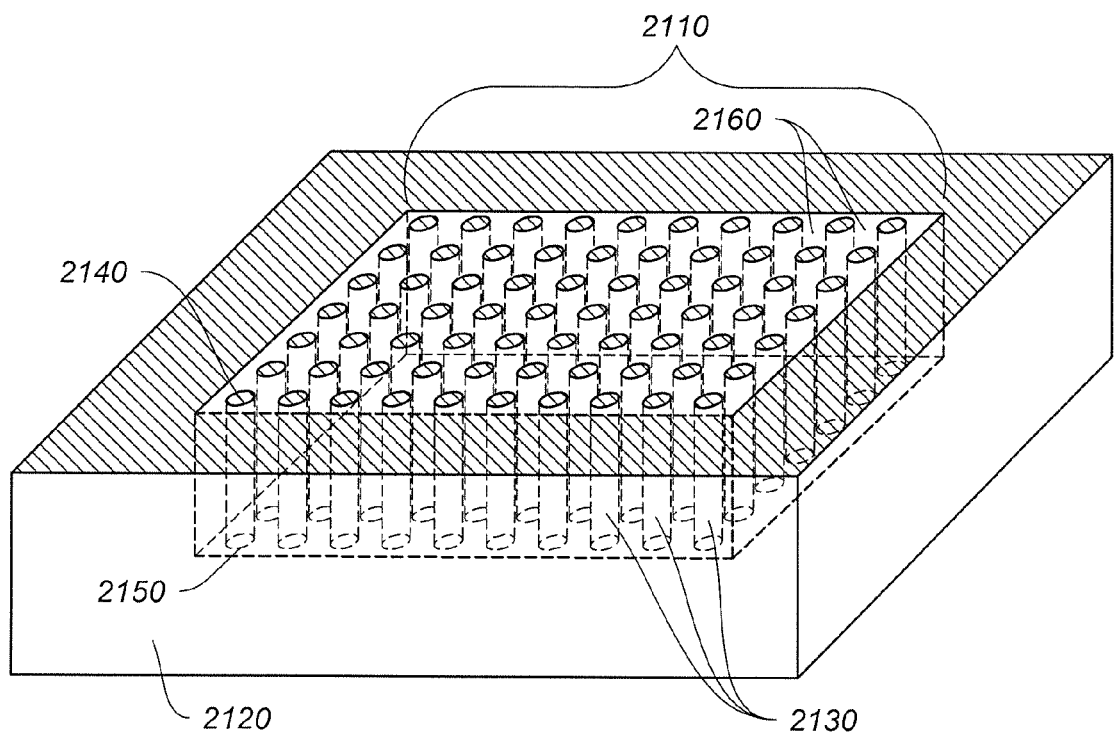
FIG. 1 is a simplified diagram showing an array of nanowires embedded in a matrix according to one embodiment of the present invention.

The present invention is directed to nanostructures. More particularly, the invention provides low thermal conductivity matrices with embedded nanostructures and methods thereof. Merely by way of example, the invention has been applied to arrays of nanostructures embedded in one or more low thermal conductivity materials for use in thermoelectric devices. However, it would be recognized that the invention has a much broader range of applicability, including but not limited to use in solar power, battery electrodes and/or energy storage, catalysis, and/or light emitting diodes.

In general, the usefulness of a thermoelectric material depends upon the physical geometry of the material. For example, the larger the surface area of the thermoelectric material that is presented on the hot and cold sides of a thermoelectric device, the greater the ability of the thermoelectric device to support heat and/or energy transfer through an increase in power density. In another example, a suitable minimum distance (i.e., the length of the thermoelectric nanostructure) between the hot and cold sides of the thermoelectric material help to better support a higher thermal gradient across the thermoelectric device. This in turn may increase the ability to support heat and/or energy transfer by increasing power density.

One type of thermoelectric nanostructure is an array of nanowires with suitable thermoelectric properties. Nanowires can have advantageous thermoelectric properties, but to date, conventional nanowires and nanowire arrays have been limited in their technological applicability due to the relatively small sizes of arrays and the short lengths of fabricated nanowires. Another type of nanostructure with thermoelectric applicability is nanoholes or nanomeshes. Nanohole or nanomesh arrays also have limited applicability due to the small volumes into which these nanostructures can be created or synthesized. For example, conventional nanostructures with lengths shorter than 100 μm have limited applicability in power generation and/or heat pumping, and conventional nanostructures with lengths shorter than 10 μm have even less applicability because the ability to maintain or establish a temperature gradient using available heat exchange technology across these short lengths is greatly diminished. Furthermore, in another example, arrays smaller than the wafer dimensions of 4, 6, 8, and 12 inches are commercially limited.

The development of large arrays of very long nanostructures formed using semiconductor materials, such as silicon, can be useful in the formation of thermoelectric devices. For example, silicon nanostructures that have a low thermal conductivity, and formed within a predetermined area of a semiconductor substrate can be utilized to form a plurality of thermoelectric elements for making a uniwafer thermoelectric device. In another example, silicon nanowires formed within the predetermined area of the semiconductor substrate can be utilized as the n- or p-type legs or both in an assembled thermoelectric device.

However, there are often many difficulties in forming and utilizing arrays of nanostructures. For example, the nanostructures are often fragile and can be easily bent or broken. In another example, the nanostructures cannot be directly applied to high temperature surfaces. In yet another example, the nanostructures cannot be exposed to harsh environments. In yet another example, the nanostructures need a support material to form reliable planar metallic contacts required for thermoelectric applications. Consequently, arrays of nanostructures would benefit from being embedded in a suitable matrix.

FIG. 1 is a simplified diagram showing an array of nanowires embedded in a matrix according to one embodiment of the present invention. This diagram is merely an example, which should not unduly limit the scope of the claims. One of ordinary skill in the art would recognize many variations, alternatives, and modifications. In FIG. 1, an array of nanowires 2110 is formed in a block of semiconductor material (e.g., a semiconductor substrate 2120). In one example, the semiconductor substrate 2120 is an entire wafer. In another example, the semiconductor substrate 2120 is a 4-inch wafer. In yet another example, the semiconductor substrate is a panel larger then a 4-inch wafer. In another example, the semiconductor substrate 2120 is a 6-inch wafer. In another example, the semiconductor substrate 2120 is an 8-inch wafer. In another example, the semiconductor substrate 2120 is a 12-inch wafer. In yet another example, the semiconductor substrate 2120 is a panel larger then a 12-inch wafer. In yet another example, the semiconductor substrate 2120 is in a shape other than that of a wafer. In yet another example, the semiconductor substrate 2120 includes silicon.

In some embodiments, the semiconductor substrate 2120 is functionalized. For example, the semiconductor substrate 2120 is doped to form an n-type semiconductor. In another example, the semiconductor substrate 2120 is doped to form a p-type semiconductor. In yet another example, the semiconductor substrate 2120 is doped using Group III and/or Group V elements. In yet another example, the semiconductor substrate 2120 is functionalized to control the electrical and/or thermal properties of the semiconductor substrate 2120. In yet another example, the semiconductor substrate 2120 includes silicon doped with boron. In yet another example, the semiconductor substrate 2120 is doped to adjust the resistivity of the semiconductor substrate 2120 to between approximately 0.00001 Ω-m and 10 Ω-m. In yet another example, the semiconductor substrate 2120 is functionalized to provide the array of nanowires 2110 with a thermal conductivity between 0.1 W/(m·K) (i.e., Watts per meter per degree Kelvin) and 500 W/(m·K).

In other embodiments, the array of nanowires 2110 is formed in the semiconductor substrate 2120. For example, the array of nanowires 2110 is formed in substantially all of the semiconductor substrate 2120. In another example, the array of nanowires 2110 includes a plurality of nanowires 2130. In yet another example, each of the plurality of nanowires 2130 has a first end 2140 and a second end 2150. In yet another example, the second ends 2150 of the plurality of nanowires 2130 collectively form an array area. In yet another example, the array area is 0.01 mm by 0.01 mm. In yet another example, the array area is 0.1 mm by 0.1 mm. In yet another example, the array area is 450 mm in diameter. In yet another example, a distance between each of the first ends 2140 of the plurality of nanowires 2130 and the second ends 2150 of each of the plurality of nanowires 2130 is at least 200 μm. In yet another example, the distance between each of the first ends 2140 of the plurality of nanowires 2130 and the second ends 2150 of each of the plurality of nanowires 2130 is at least 300 μm. In yet another example, the distance between each of the first ends 2140 of the plurality of nanowires 2130 and the second ends 2150 of each of the plurality of nanowires 2130 is at least 400 μm. In yet another example, the distance between each of the first ends 2140 of the plurality of nanowires 2130 and the second ends 2150 of each of the plurality of nanowires 2130 is at least 500 μm. In yet another example, the distance between each of the first ends 2140 of the plurality of nanowires 2130 and the second ends 2150 of each of the plurality of nanowires 2130 is at least 525 μm.

In yet another example, all the nanowires of the plurality of nanowires 2130 are substantially parallel to each other. In yet another example, the plurality of nanowires 2130 is formed substantially vertically in the semiconductor substrate 2120. In yet another example, the plurality of nanowires 2130 are oriented substantially perpendicular to the array area. In yet another example, each of the plurality of nanowires 2130 has a roughened surface. In yet another example, each of the plurality of nanowires 2130 includes a substantially uniform cross-sectional area with a large ratio of length to cross-sectional area. In yet another example, the cross-sectional area of each of the plurality of nanowires 2130 is substantially circular. In yet another example, the cross-sectional area of each of the plurality of nanowires 2130 is between 1 nm to 250 nm across.

In yet other embodiments, the plurality of nanowires 2130 have respective spacings 2160 between them. For example, each of the respective spacings 2160 is between 25 nm to 1000 nm across. In another example, the respective spacings 2160 are substantially filled with one or more fill materials. In yet another example, the one or more fill materials form a matrix. In yet another example, the matrix is porous. In yet another example, the one or more fill materials have a low thermal conductivity. In yet another example, the thermal conductivity is between 0.0001 W/(m·K) and 50 W/(m·K). In yet another example, the one or more fill materials provide added mechanical stability to the plurality of nanowires 2130.

In yet another example, the one or more fill materials are able to withstand temperatures in excess of 350° C. for extended periods of device operation. In yet another example, the one or more fill materials are able to withstand temperatures in excess of 550° C. for extended periods of device operation. In yet another example, the one or more fill materials are able to withstand temperatures in excess of 650° C. for extended periods of device operation. In yet another example, the one or more fill materials are able to withstand temperatures in excess of 750° C. In yet another example, the one or more fill materials are able to withstand temperatures in excess of 800° C. In yet another example, the one or more fill materials have a low coefficient of thermal expansion. In yet another example, the linear coefficient of thermal expansion is between 0.01 μm/m·K. and 30 μm/m·K. In yet another example, the one or more fill materials are able to be planarized. In yet another example, the one or more fill materials are able to be polished. In yet another example, the one or more fill materials provide a support base for additional material overlying thereon. In yet another example, the one or more fill materials are conductive. In yet another example, the one or more fill materials support the formation of good electrical contacts with the plurality of nanowires 2130. In yet another example, the one or more fill materials support the formation of good thermal contacts with the plurality of nanowires 2130.

In yet other embodiments, the one or more fill materials each include at least one selected from a group consisting of photoresist, spin-on glass, spin-on dopant, aerogel, xerogel, and oxide, and the like. For example, the photoresist includes long UV wavelength G-line (e.g., approximately 436 nm) photoresist. In another example, the photoresist has negative photoresist characteristics. In yet another example, the photoresist exhibits good adhesion to various substrate materials, including Si, GaAs, InP, and glass. In yet another example, the photoresist exhibits good adhesion to various metals, including Au, Cu, and Al. In yet another example, the spin on glass has a high dielectric constant. In yet another example, the spin-on dopant includes n-type and/or p-type dopants. In yet another example, the spin-on dopant is applied regionally with different dopants in different areas of the array of nanowires 2110. In yet another example, the spin-on dopant includes boron and/or phosphorous and the like. In yet another example, the spin-on glass includes one or more spin-on dopants. In yet another example, the aerogel is derived from silica gel characterized by an extremely low thermal conductivity of about 0.1 W/(m·K) and lower. In yet another example, the one or more fill materials include long chains of one or more oxides. In yet another example, the oxide includes $Al_2O_3$, FeO, $FeO_2$, $Fe_2O_3$, TiO, $TiO_2$, $ZrO_2$, ZnO, $HfO_2$, CrO, $Ta_2O_5$, SiN, TiN, BN, $SiO_2$, AlN, CN, and/or the like.

According to some embodiments, the array of nanowires 2110 embedded in the one or more fill materials has useful characteristics. For example, the embedded array of nanowires 2110 is well aligned. In another example, the embedded array of nanowires 2110 survives high temperature gradients without breaking. In yet another example, the embedded array of nanowires 2110 survives high temperature gradients without bending or breaking of the plurality of nanowires 2130. In yet another example, the enhanced mechanical strength of the embedded array of nanowires 2110 allows one or more surface polishing and/or planarization processes to be carried out on one or more surfaces of the embedded array of nanowires 2110. In yet another example, the enhanced mechanical strength of the embedded array of nanowires 2110 provides support for handling, machining, and/or manufacturing processes to be carried out on the embedded array of nanowires 2110. In yet another example, one or more conductive materials is placed on the embedded array of nanowires to form one or more electric contacts with one or more pluralities of first ends 2140 of one or more pluralities of the nanowires 2130. In yet another example, the one or more conductive materials is configured to form one or more good thermal contacts with one or more surfaces for establishing one or more thermal paths through the one or more pluralities of the nanowires 2130 while limiting thermal leakage in the one or more fill materials.

Figure 2:
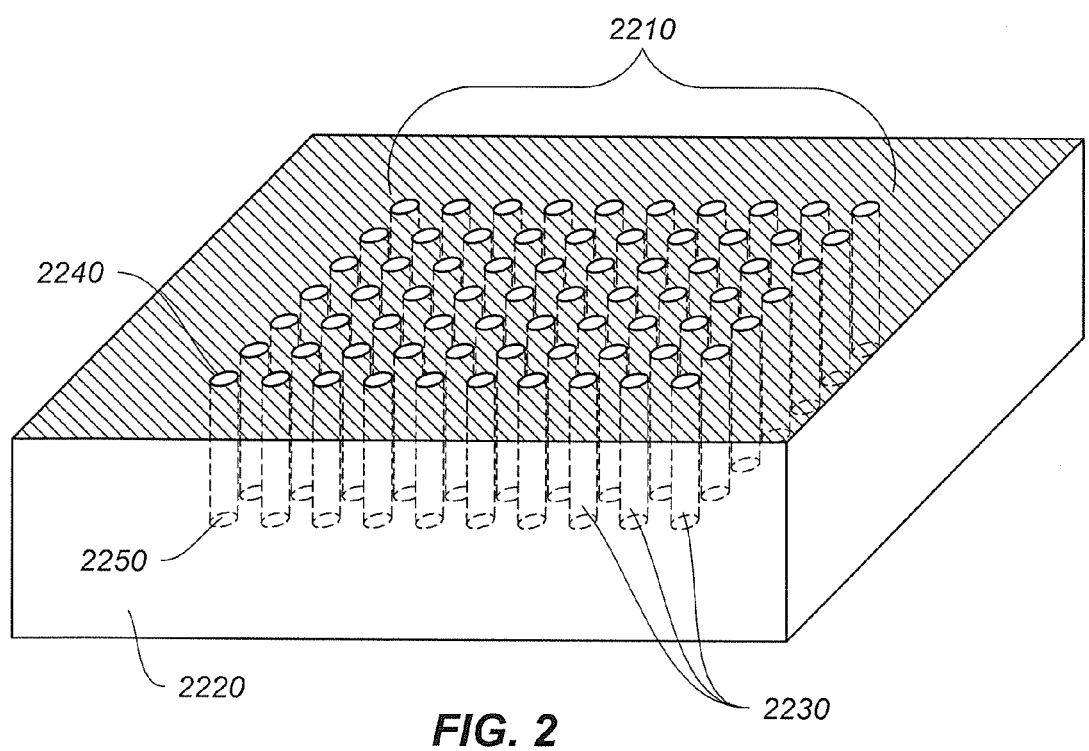
FIG. 2 is a simplified diagram showing an array of nanoholes embedded in a matrix according to another embodiment of the present invention.

FIG. 2 is a simplified diagram showing an array of nanoholes embedded in a matrix according to another embodiment of the present invention. This diagram is merely an example, which should not unduly limit the scope of the claims. One of ordinary skill in the art would recognize many variations, alternatives, and modifications. In FIG. 2, an array of nanoholes 2210 is formed in a block of semiconductor material (e.g., a semiconductor substrate 2220). In one example, the semiconductor substrate 2220 is an entire wafer. In another example, the semiconductor substrate 2220 is a 4-inch wafer. In another example, the semiconductor substrate 2220 is a 6-inch wafer. In another example, the semiconductor substrate 2220 is an 8-inch wafer. In another example, the semiconductor substrate 2220 is a 12-inch wafer. In yet another example, the semiconductor substrate 2220 is a panel larger then a 12-inch wafer. In yet another example, the semiconductor substrate 2220 is in a shape other than that of a wafer. In yet another example, the semiconductor substrate 2220 includes silicon.

In some embodiments, the semiconductor substrate 2220 is functionalized. For example, the semiconductor substrate 2220 is doped to form an n-type semiconductor. In another example, the semiconductor substrate 2220 is doped to form a p-type semiconductor. In yet another example, the semiconductor substrate 2220 is doped using Group III and/or Group V elements. In yet another example, the semiconductor substrate 2220 is functionalized to control the electrical and/or thermal properties of the semiconductor substrate 2220. In yet another example, the semiconductor substrate 2220 includes silicon doped with boron. In yet another example, the semiconductor substrate 2220 is doped to adjust the resistivity of the semiconductor substrate 2220 to between approximately 0.00001 Ω-m and 10 Ω-m. In yet another example, the semiconductor substrate 2220 is functionalized to provide the array of nanoholes 2210 with a thermal conductivity between 0.1 W/m·K and 500 W/m·K.

In other embodiments, the array of nanoholes 2210 is formed in the semiconductor substrate 2220. For example, the array of nanoholes 2210 is formed in substantially all of the semiconductor substrate 2220. In another example, the array of nanoholes 2210 includes a plurality of nanoholes 2230. In yet another example, each of the plurality of nanoholes 2230 has a first end 2240 and a second end 2250. In yet another example, the second ends 2250 of the plurality of nanoholes 2230 collectively form an array area. In yet another example, the array area is 0.01 mm by 0.01 mm. In yet another example, the array area is 0.1 mm by 0.1 mm. In yet another example, the array area is 450 mm in diameter. In yet another example, a distance between each of the first ends 2240 of the plurality of nanoholes 2230 and the second ends 2250 of each of the plurality of nanoholes 2230 is at least 200 μm. In yet another example, the distance between each of the first ends 2240 of the plurality of nanoholes 2230 and the second ends 2250 of each of the plurality of nanoholes 2230 is at least 300 μm. In yet another example, the distance between each of the first ends 2240 of the plurality of nanoholes 2230 and the second ends 2250 of each of the plurality of nanoholes 2230 is at least 400 μm. In yet another example, the distance between each of the first ends 2240 of the plurality of nanoholes 2230 and the second ends 2250 of each of the plurality of nanoholes 2230 is at least 500 μm. In yet another example, the distance between each of the first ends 2240 of the plurality of nanoholes 2230 and the second ends 2250 of each of the plurality of nanoholes 2230 is at least 525 μm.

In yet another example, all the nanoholes of the plurality of nanoholes 2230 are substantially parallel to each other. In yet another example, the plurality of nanoholes 2230 is formed substantially vertically in the semiconductor substrate 2210. In yet another example, the plurality of nanoholes 2230 are oriented substantially perpendicular to the array area. In yet another example, each of the plurality of nanoholes 2230 has a roughened surface. In yet another example, each of the plurality of nanoholes 2230 are spaced between 25 nm to 1000 nm from each other.

In yet other embodiments, each of the plurality of nanoholes 2230 includes a substantially uniform cross-sectional area with a large ratio of length to cross-sectional area. For example, the cross-sectional area of each of the plurality of nanoholes 2230 is substantially circular. In another example, the cross-sectional area of each of the plurality of nanoholes 2230 is between 1 nm to 250 nm across. In yet another example, each of the plurality of nanoholes 2230 are substantially filled with one or more fill materials. In yet another example, the one or more fill materials form a matrix. In yet another example, the matrix is porous. In yet another example, the one or more fill materials have a low thermal conductivity. In yet another example, the thermal conductivity is between 0.0001 W/(m·K) and 50 W/(m·K). In yet another example, the one or more fill materials provide added mechanical stability to the plurality of nanoholes 2230. In yet another example, the one or more fill materials are able to withstand temperatures in excess of 650° C. for extended periods of device operation. In yet another example, the one or more fill materials are able to withstand temperatures in excess of 750° C. during subsequent device fabrication. In yet another example, the one or more fill materials have a low coefficient of thermal expansion. In yet another example, the linear coefficient of thermal expansion is between 0.01 μm/m·K and 30 μm/m·K. In yet another example, the one or more fill materials are able to be planarized. In yet another example, the one or more fill materials are able to be polished. In yet another example, the one or more fill materials provide a support base for additional material overlying thereon. In yet another example, the one or more fill materials are conductive. In yet another example, the one or more fill materials support the formation of good electrical contacts with the plurality of nanoholes 2230. In yet another example, the one or more fill materials support the formation of good thermal contacts with the plurality of nanoholes 2230.

In yet other embodiments, the one or more fill materials each include at least one selected from a group consisting of photoresist, spin-on glass, spin-on dopant, aerogel, xerogel, and oxide, and the like. For example, the photoresist includes long UV wavelength G-line (e.g., approximately 436 nm) photoresist. In another example, the photoresist has negative photoresist characteristics. In yet another example, the photoresist exhibits good adhesion to various substrate materials, including Si, GaAs, InP, and glass. In yet another example, the photoresist exhibits good adhesion to various metals, including Au, Cu, and Al. In yet another example, the spin on glass has a high dielectric constant. In yet another example, the spin-on dopant includes n-type and/or p-type dopants. In yet another example, the spin-on dopant is applied regionally with different dopants in different areas of the array of nanoholes 2210. In yet another example, the spin-on dopant includes boron and/or phosphorous and the like. In yet another example, the spin-on glass includes one or more spin-on dopants. In yet another example, the aerogel is derived from silica gel characterized by an extremely low thermal conductivity of about 0.1 W/(m·K) and lower. In yet another example, the one or more fill materials include long chains of one or more oxides. In yet another example, the oxide includes $Al_2O_3$, FeO, $FeO_2$, $Fe_2O_3$, TiO, $TiO_2$, $ZrO_2$, ZnO, $HfO_2$, CrO, $Ta_2O_5$, SiN, TiN, BN, $SiO_2$, AlN, CN, and/or the like.

According to some embodiments, the array of nanoholes 2210 embedded in the one or more fill materials has useful characteristics. For example, the embedded array of nanoholes 2210 is well aligned. In another example, the embedded array of nanoholes 2210 survives high temperature gradients without breaking. In yet another example, the embedded array of nanoholes 2210 survives high temperature gradients without bending or breaking of the semiconductor material surrounding the plurality of nanoholes 2230. In yet another example, the enhanced mechanical strength of the embedded array of nanoholes 2210 allows one or more surface polishing and/or planarization processes to be carried on one or more surfaces of the embedded array of nanoholes 2210. In yet another example, the enhanced mechanical strength of the embedded array of nanoholes 2210 provides support for handling, machining, and/or manufacturing processes to be carried out on the embedded array of nanoholes 2210. In yet another example, one or more conductive materials is placed on the embedded array of nanowires to form one or more electric contacts with one or more pluralities of first ends 2140 of one or more pluralities of the nanoholes 2230. In yet another example, the one or more conductive materials is configured to form one or more good thermal contacts with one or more surfaces for establishing one or more thermal paths through the one or more pluralities of the nanoholes 2230 while limiting thermal leakage in the one or more fill materials.

Figure 3:
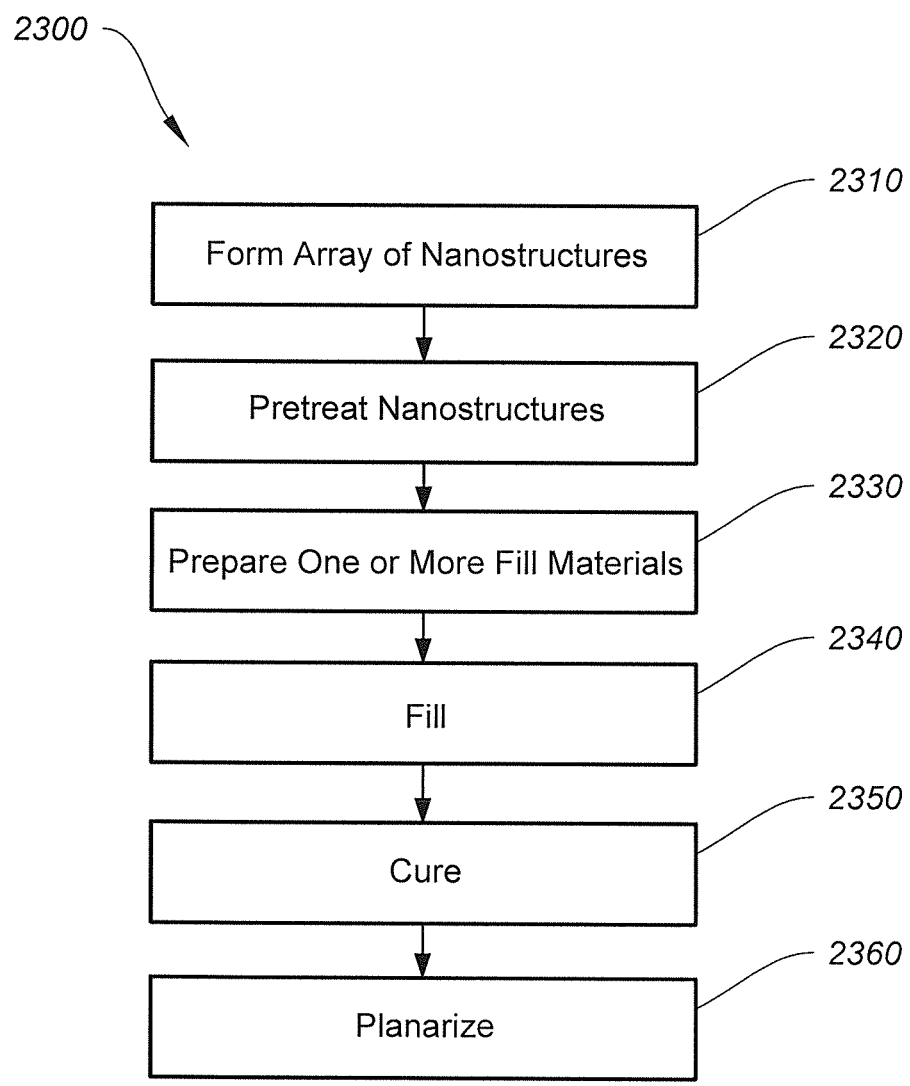
FIG. 3 is a simplified diagram showing a method for forming an array of nanostructures embedded in a matrix according to one embodiment of the present invention.

FIG. 3 is a simplified diagram showing a method for forming an array of nanostructures embedded in a matrix according to one embodiment of the present invention. This diagram is merely an example, which should not unduly limit the scope of the claims. One of ordinary skill in the art would recognize many variations, alternatives, and modifications. The method 2300 includes a process 2310 for forming an array of nanostructures, a process 2320 for pretreating the array of nanostructures, a process 2330 for preparing one or more fill materials, a process 2340 for filling the array of nanostructures, a process 2350 for curing the one or more fill materials, and a process 2360 for planarizing the filled array of nanostructures. For example, the method 2300 is used to form the plurality of nanowires 2130 embedded in a matrix as shown in FIG. 1. In another example, the method 2300 is used to form the plurality of nanoholes 2230 embedded in a matrix as shown in FIG. 2. In yet another example, the processes 2320, 2350, and/or 2360 are skipped.

Figure 4:
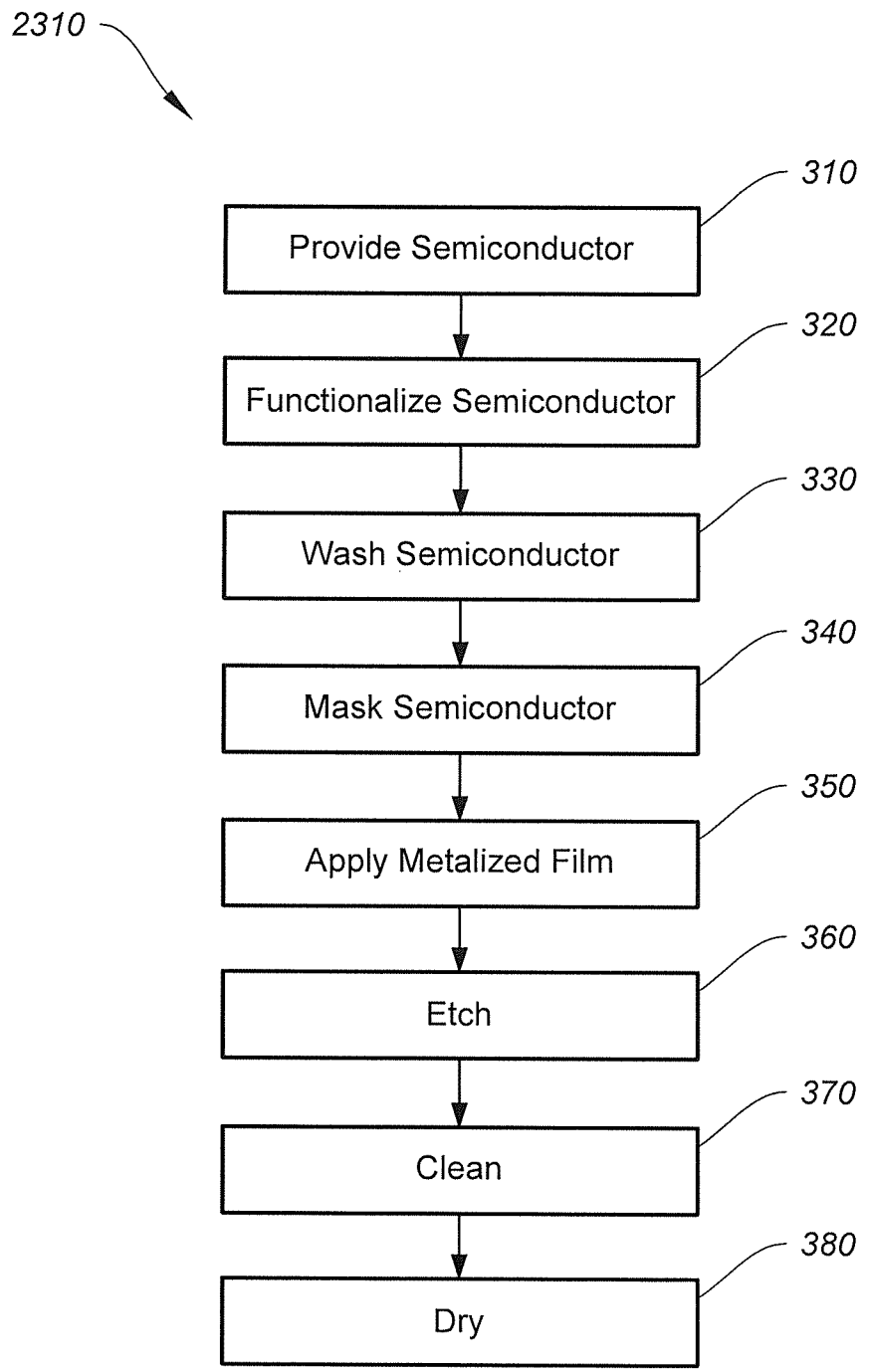
FIG. 4 is a simplified diagram showing the process for forming an array of nanostructures as part of the method for forming an array of nanostructures embedded in a matrix according to one embodiment of the present invention.

FIG. 4 is a simplified diagram showing the process 2310 for forming an array of nanostructures as part of the method 2300 for forming an array of nanostructures embedded in a matrix according to one embodiment of the present invention. This diagram is merely an example, which should not unduly limit the scope of the claims. One of ordinary skill in the art would recognize many variations, alternatives, and modifications. The process 2310 includes a process 310 for providing the semiconductor substrate, a process 320 for functionalizing the semiconductor substrate, a process 330 for washing the semiconductor substrate, a process 340 for masking portions of the semiconductor substrate, a process 350 for applying a metalized film to the semiconductor substrate, a process 360 for etching the semiconductor substrate, a process 370 for cleaning the etched semiconductor substrate, and a process 380 for drying the etched semiconductor substrate.

Figure 5:
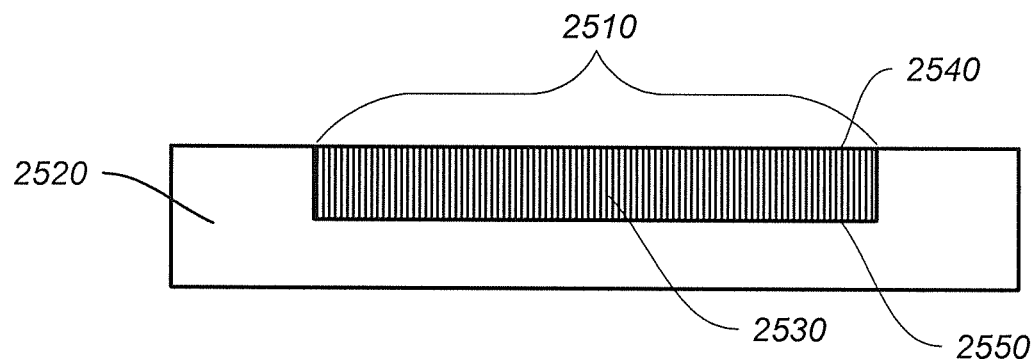
FIG. 5 is a simplified diagram showing an array of nanostructures formed as part of the method for forming an array of nanostructures embedded in a matrix according to one embodiment of the present invention.

FIG. 5 is a simplified diagram showing an array of nanostructures formed as part of the method 2300 for forming an array of nanostructures embedded in a matrix according to one embodiment of the present invention. This diagram is merely an example, which should not unduly limit the scope of the claims. One of ordinary skill in the art would recognize many variations, alternatives, and modifications. In FIG. 5, an array of nanostructures 2510 is formed in a block of semiconductor material (e.g., a semiconductor substrate 2520). In one example, the semiconductor substrate 2520 is an entire wafer. In another example, the semiconductor substrate 2520 is a 4-inch wafer. In yet another example, the semiconductor substrate is a panel larger then a 4-inch wafer. In yet another example, the semiconductor substrate 2520 includes silicon. In yet another example, the semiconductor substrate 2520 is the semiconductor substrate 2120 and/or the semiconductor substrate 2220.

In some embodiments, the semiconductor substrate 2520 is functionalized. For example, the semiconductor substrate 2520 is doped to form an n-type semiconductor. In another example, the semiconductor substrate 2520 is doped to form a p-type semiconductor. In yet another example, the semiconductor substrate 2520 is doped using Group III and/or Group V elements. In yet another example, the semiconductor substrate 2520 is functionalized to control the electrical and/or thermal properties of the semiconductor substrate 2520. In yet another example, the semiconductor substrate 2520 includes silicon doped with boron. In yet another example, the semiconductor substrate 2520 is doped to adjust the resistivity of the semiconductor substrate 2520 to between approximately 0.00001 Ω-m and 10 Ω-m. In yet another example, the semiconductor substrate 2520 is functionalized to provide the array of nanostructures 2510 with a thermal conductivity between 0.1 W/m-K and 500 W/m-K.

In other embodiments, the array of nanostructures 2510 is formed in the semiconductor substrate 2520. For example, the array of nanostructures 2510 is formed in substantially all of the semiconductor substrate 2520. In another example, the array of nanostructures 2510 includes a plurality of nanostructures 2530. In yet another example, each of the plurality of nanostructures 2530 has a first end 2540 and a second end 2550. In yet another example, the second ends 2550 of the plurality of nanostructures 2530 collectively form an array area. In yet another example, the array area is 0.01 mm by 0.01 mm. In yet another example, the array area is 0.1 mm by 0.1 mm. In yet another example, the array area is 450 mm in diameter. In yet another example, a distance between each of the first ends 2540 of the plurality of nanostructures 2530 and the second ends 2550 of each of the plurality of nanostructures 2530 is at least 200 µm. In yet another example, the distance between each of the first ends 2540 of the plurality of nanostructures 2530 and the second ends 2550 of each of the plurality of nanostructures 2530 is at least 300 µm. In yet another example, the distance between each of the first ends 2540 of the plurality of nanostructures 2530 and the second ends 2550 of each of the plurality of nanostructures 2530 is at least 400 µm. In yet another example, the distance between each of the first ends 2540 of the plurality of nanostructures 2530 and the second ends 2550 of each of the plurality of nanostructures 2530 is at least 500 µm. In yet another example, the distance between each of the first ends 2540 of the plurality of nanostructures 2530 and the second ends 2550 of each of the plurality of nanostructures 2530 is at least 525 µm.

In yet another example, all the nanostructures of the plurality of nanostructures 2530 are substantially parallel to each other. In yet another example, the plurality of nanostructures 2530 is formed substantially vertically in the semiconductor substrate 2510. In yet another example, the plurality of nanostructures 2530 are oriented substantially perpendicular to the array area. In yet another example, each of the plurality of nanostructures 2530 has a roughened surface. In yet another example, each of the plurality of nanostructures 2530 are spaced between 25 nm to 1000 nm from each other. In yet another example, each of the plurality of nanostructures 2530 includes a substantially uniform cross-sectional area with a large ratio of length to cross-sectional area. In yet another example, the cross-sectional area of each of the plurality of nanostructures 2530 is substantially circular. In another example, the cross-sectional area of each of the plurality of nanostructures 2530 is between 1 nm to 1000 nm across.

According to some embodiments, the array of nanostructures 2510 is the array of nanowires 2110 as shown in FIG. 1. For example, the plurality of nanostructures 2530 is the plurality of nanowires 2130. According to some embodiments, the array of nanostructures 2510 is the array of nanoholes 2210 as shown in FIG. 2. For example, the plurality of nanostructures 2530 is the plurality of nanoholes 2230.

As discussed above and further emphasized here, FIG. 5 is merely an example, which should not unduly limit the scope of the claims. One of ordinary skill in the art would recognize many variations, alternatives, and modifications. In some embodiments, nanostructures other than nanowires or nanoholes are formed. For example, nanotubes and/or nanomeshes are formed in the semiconductor substrate 2520. In certain embodiments, more than one plurality of nanostructures is formed in a semiconductor substrate.

Figure 6A:
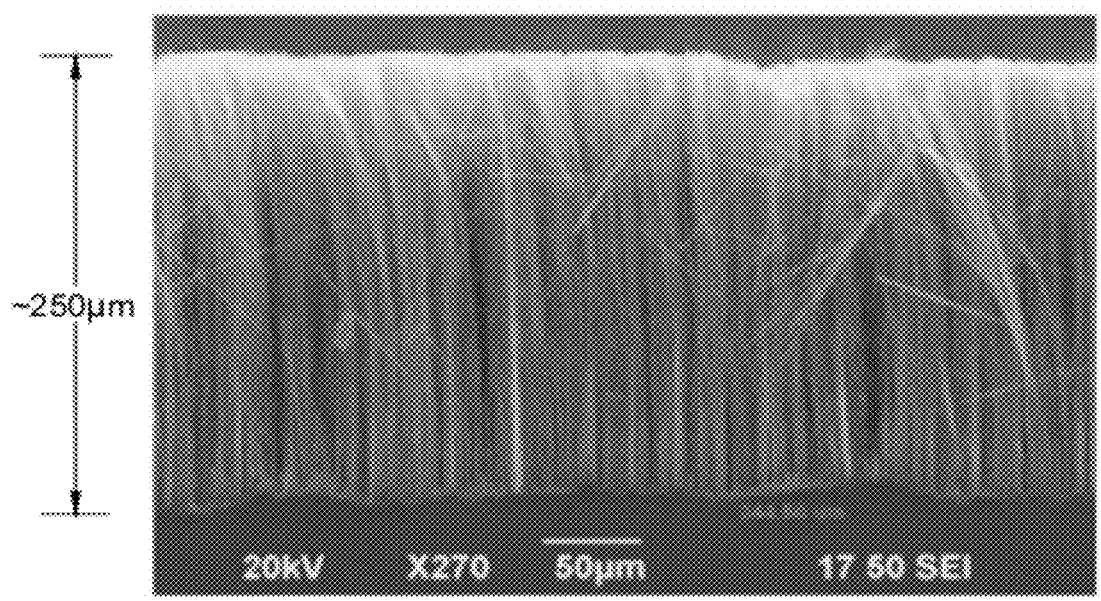
FIGS. 6A, 6B, and 6C are scanning electron microscope images showing various views of the plurality of nanostructures as part of the method for forming an array of nanostructure embedded in a matrix according to certain embodiments of the present invention.
Figure 6B:
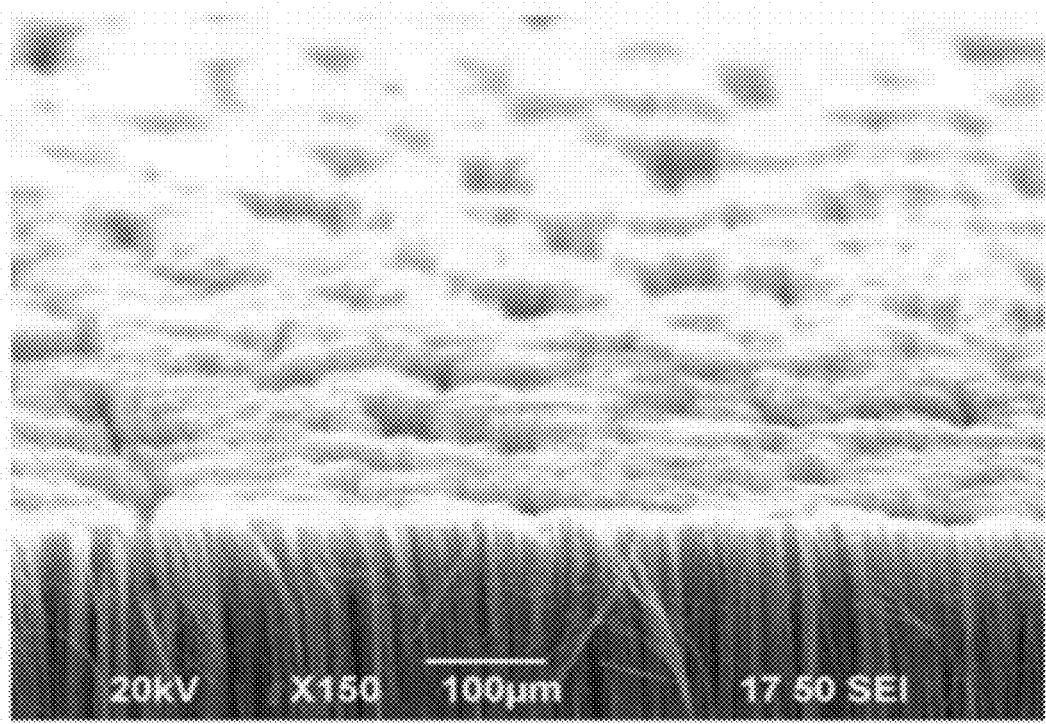
Figure 6C:
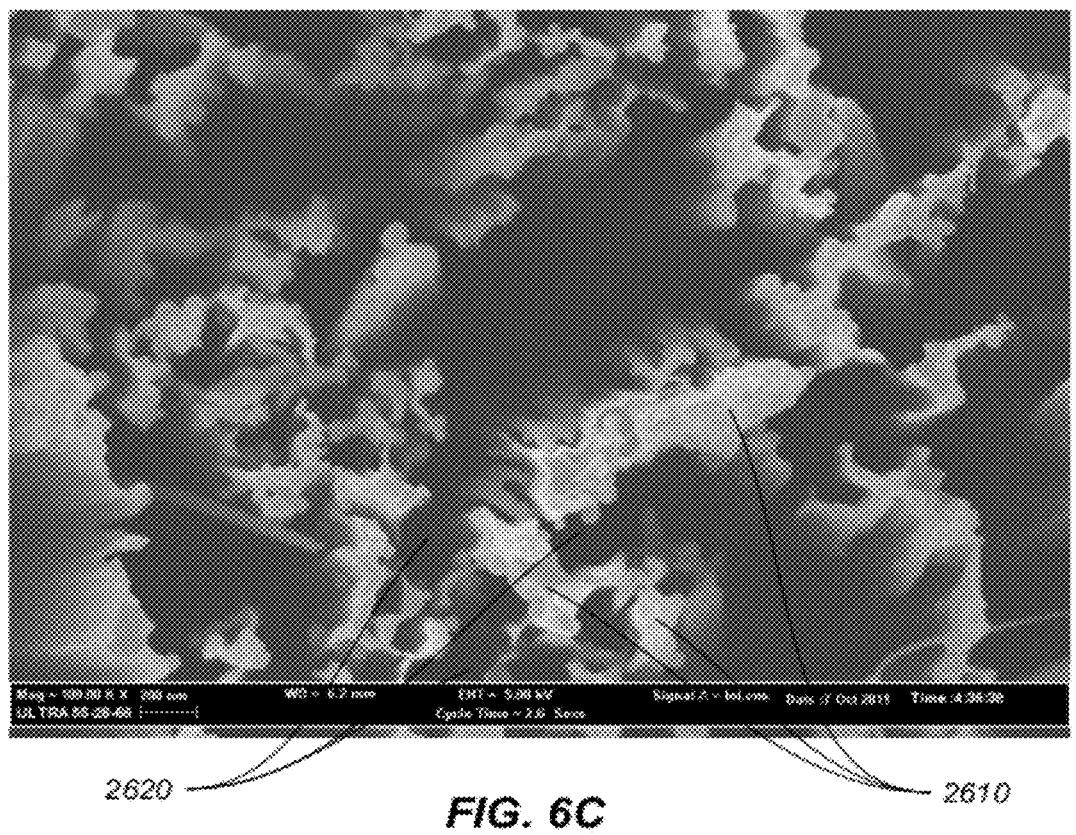

FIGS. 6A, 6B, and 6C are scanning electron microscope images showing various views of the plurality of nanostructures 2530 as part of the method 2300 for forming an array of nanostructure embedded in a matrix according to certain embodiments of the present invention. These images are merely examples, which should not unduly limit the scope of the claims. One of ordinary skill in the art would recognize many variations, alternatives, and modifications. FIGS. 6A and 6B show a plurality of nanowires with a large ratio of length to cross-sectional area and that are substantially parallel with each other. FIG. 6C shows the top view of a plurality of nanostructures 2610 with a plurality of voids 2620 between the plurality of nanostructures 2610. For example, the plurality of nanostructures 2610 is the plurality of nanowires 2130 of FIG. 1. In another example, the plurality of voids 2620 are the respective spacings 2160 of FIG. 1. In yet another example, the plurality of voids 2620 is the plurality of nanoholes 2230 of FIG. 2.

Figure 7:
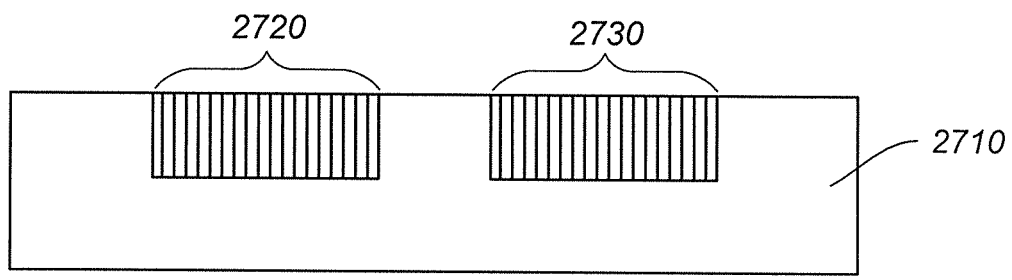
FIG. 7 is a simplified diagram showing formation of a first array of nanostructures and a second array of nanostructures as part of the method for forming an array of nanostructures embedded in a matrix according to one embodiment of the present invention.

FIG. 7 is a simplified diagram showing formation of a first array of nanostructures and a second array of nanostructures as part of the method 2300 for forming an array of nanostructures embedded in a matrix according to one embodiment of the present invention. This diagram is merely an example, which should not unduly limit the scope of the claims. One of ordinary skill in the art would recognize many variations, alternatives, and modifications. For example, as shown in FIG. 7, the semiconductor substrate 2710 includes the first array of nanostructures 2720 and the second array of nanostructures 2730. In another example, the semiconductor substrate 2710 is the semiconductor substrate 2520. In yet another example, the first array of nanostructures 2720 and the second array of nanostructures 2730 are the array of nanostructures 2510.

Figure 8:
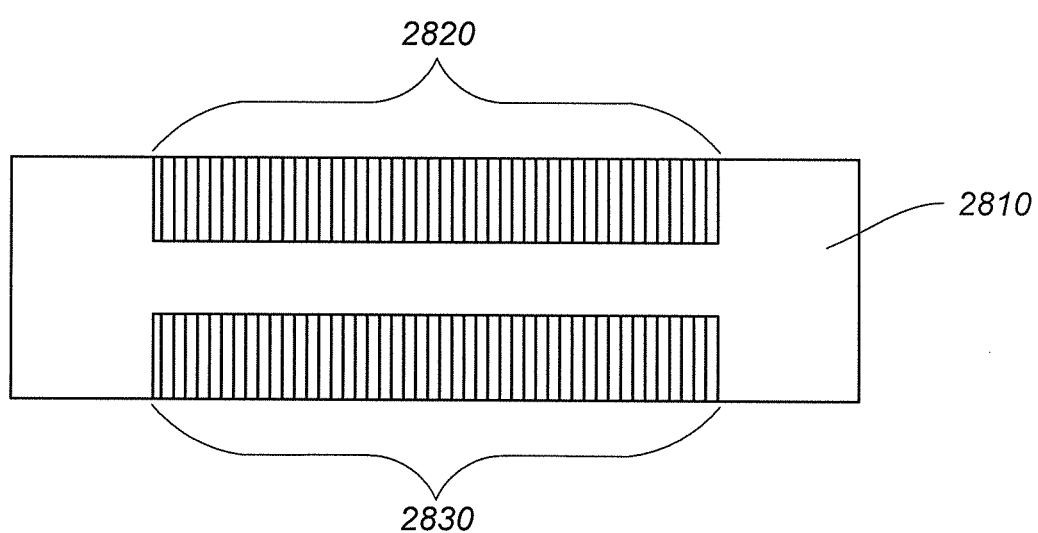
FIG. 8 is a simplified diagram showing formation of a first array of nanostructures and a second array of nanostructures as part of the method for forming an array of nanostructures embedded in a matrix according to another embodiment of the present invention.

FIG. 8 is a simplified diagram showing formation of a first array of nanostructures and a second array of nanostructures as part of the method 2300 for forming an array of nanostructures embedded in a matrix according to another embodiment of the present invention. This diagram is merely an example, which should not unduly limit the scope of the claims. One of ordinary skill in the art would recognize many variations, alternatives, and modifications. For example, as shown in FIG. 8, the semiconductor substrate 2810 includes the first array of nanostructures 2820 and the second array of nanostructures 2830. In another example, the semiconductor substrate 2810 is the semiconductor substrate 2520. In yet another example, the first array of nanostructures 2820 and the second array of nanostructures 2830 are the array of nanostructures 2510.

Referring back to FIG. 3, at the optional process 2320, the array of nanostructures is pretreated. For example, the hydrophobicity of each of the surfaces of each of the plurality of nanostructures in the array of nanostructures is altered. In another example, the surface energy of each of the surfaces of each of the plurality of nanostructures is modified. In yet another example, each of the surfaces of each of the plurality of nanostructures is made more hydrophobic. In yet another example, each of the surfaces of each of the plurality of nanostructures is made more hydrophilic. In yet another example, each of the surfaces of each of the plurality of nanostructures are pretreated by thermal diffusion. In yet another example, each of the surfaces of each of the plurality of nanostructures are pretreated by doping. In yet another example, each of the surfaces of each of the plurality of nanostructures are pretreated using ultraviolet (UV) light. In yet another example, each of the surfaces of each of the plurality of nanostructures are pretreated using ozone.

According to one embodiment, at the process 2330, one or more fill materials are prepared. For example, the one or more fill materials have a low thermal conductivity. In yet another example, the thermal conductivity is between 0.0001 W/(m·K) and 50 W/(m·K). In yet another example, the one or more fill materials provide added mechanical stability to the plurality of nanostructures 2530. In yet another example, the one or more fill materials are able to withstand temperatures in excess of 650° C. for extended periods of device operation. In yet another example, the one or more fill materials are able to withstand temperatures in excess of 750° C. during subsequent device fabrication. In yet another example, the linear coefficient of thermal expansion is between 0.01 μm/m·K and 30 μm/m·K. In yet another example, the one or more fill materials are able to be planarized. In yet another example, the one or more fill materials are able to be polished. In yet another example, the one or more fill materials provide a support base for additional material overlying thereon. In yet another example, the one or more fill materials are conductive. In yet another example, the one or more fill materials support the formation of good electrical contacts with the plurality of nanostructures 2530. In yet another example, the one or more fill materials support the formation of good thermal contacts with the plurality of nanostructures 2530.

In another embodiment, the one or more fill materials each include at least one selected from a group consisting of photoresist, spin-on glass, spin-on dopant, aerogel, xerogel, and oxide, and the like. For example, the one or more photoresists include long UV wavelength G-line photoresist. For example, the photoresist includes long UV wavelength G-line (e.g., approximately 436 nm) photoresist. In another example, the photoresist has negative photoresist characteristics. In yet another example, the photoresist exhibits good adhesion to various substrate materials, including Si, GaAs, InP, and glass. In yet another example, the photoresist exhibits good adhesion to various metals, including Au, Cu, and Al. In yet another example, the spin on glass has a high dielectric constant. In yet another example, the spin-on dopant includes n-type and/or p-type dopants. In yet another example, the spin-on dopant is applied regionally with different dopants in different areas of the array of nanostructures. In yet another example, the spin-on dopant includes boron and/or phosphorous and the like. In yet another example, the spin-on glass includes one or more spin-on dopants. In yet another example, the aerogel is derived from silica gel characterized by an extremely low thermal conductivity of about 0.1 W/(m·K) and lower. In yet another example, the one or more fill materials include long chains of one or more oxides. In yet another example, the oxide includes $Al_2O_3$, FeO, $FeO_2$, $Fe_2O_3$, TiO, $TiO_2$, $ZrO_2$, ZnO, $HfO_2$, CrO, $Ta_2O_5$, SiN, TiN, BN, $SiO_2$, AlN, CN, and/or the like.

In yet another embodiment, the one or more fill materials are prepared for use. For example, the one or more fill materials are placed into solution using one or more solvents. In another example, the one or more solvents include one or more selected from a group consisting of alcohol, acetone, and/or a non-polar solvent and the like. In yet another example, the one or more solvents include alcohol, acetone, and/or the like when the surfaces of each of the plurality of nanostructures are hydrophilic. In yet another example, the one or more solvents include one or more non-polar solvents when the surfaces of each of the plurality of nanostructures are hydrophobic. In yet another example, the one or more fill materials are prepared by heating them until they are in liquid form. In yet another example, the one or more fill materials are doped using one or more dopants.

At the process 2340, the array of nanostructures is filled using the one or more fill materials. For example, the one or more fill materials are used to form a matrix. In another example, the matrix embeds the plurality of nanostructures. In yet another example, the array of nanostructures corresponds to a plurality of voids. In yet another example, the plurality of voids is filled by the one or more fill materials. In yet another example, the process 2340 uses different filling processes. In yet another example, the choice of fill process depends on the one or more fill materials to be used. In yet another example, the choice of fill process depends on the desired composition and profile of the matrix to be created.

Figure 9:
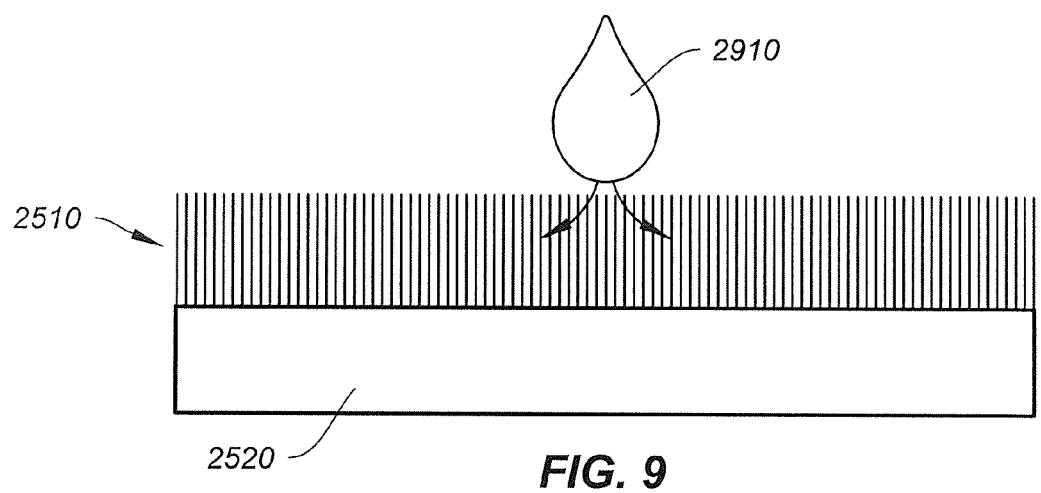
FIG. 9 is a simplified diagram showing a side view of the array of nanostructures during a spin-on coating process used to fill the array of nanostructures during the fill process as part of the method of FIG. 3 according to one embodiment of the present invention.

FIG. 9 is a simplified diagram showing a side view of the array of nanostructures 2510 during a spin-on coating process used to fill the array of nanostructures 2510 during the fill process 2340 as part of the method of FIG. 3 according to one embodiment of the present invention. This diagram is merely an example, which should not unduly limit the scope of the claims. One of ordinary skill in the art would recognize many variations, alternatives, and modifications. As shown in FIG. 9, the spin-on coating process is used with one or more fill materials in liquid form. In another example, the spin-on coating technique uses photoresists, one or more spin-on glasses, one or more spin-on dopants, aerogel, and/or xerogel and the like as the one or more fill materials. In yet another example, an excess amount of the one or more fill materials 2910 is placed onto the array of nanostructures 2510. In yet another example, the array of nanostructures 2510 and the semiconductor substrate 2520 are rotated at high speed. In yet another example, the one or more fill materials 2910 spread out by centrifugal force to fill the array of nanostructures 2510. In yet another example, excess amounts of the one or more fill materials spins out of the array of nanostructures 2510 and off the edges of the semiconductor substrate 2520. In yet another example, the amount of the one or more fill materials 2920 is determined and/or systematically optimized to ensure that all regions of the array of nanostructures 2510 is slightly over-filled. In yet another example, the spin-on coating process is aided by capillary force.

Figure 10:
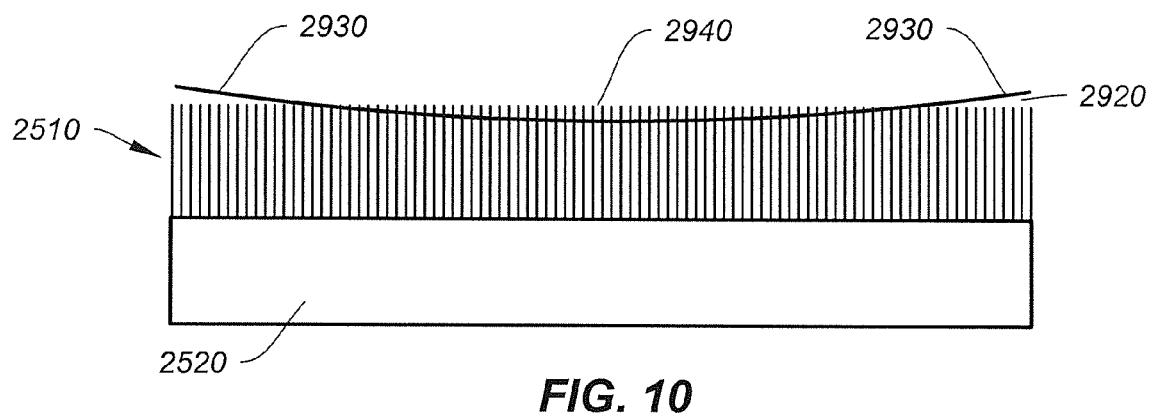
FIG. 10 is a simplified diagram showing a side view of the array of nanostructures after a spin-on coating process is used to fill the array of nanostructures as part of the method of FIG. 3 according to one embodiment of the present invention.

FIG. 10 is a simplified diagram showing a side view of the array of nanostructures 2510 after a spin-on coating process is used to fill the array of nanostructures 2510 as part of the method of FIG. 3 according to one embodiment of the present invention. This diagram is merely an example, which should not unduly limit the scope of the claims. One of ordinary skill in the art would recognize many variations, alternatives, and modifications. As shown in FIG. 10, the one or more fill materials 2920 is distributed throughout the array of nanostructures 2510. For example, a desired coverage of the one or more fill materials 2920 overlays the array of nanostructures 2510. In another example, a greater amount of the one or more fill materials 2920 is positioned at the edges 2930 of the array of nanostructures 2510 than is positioned at the center 2940 of the array of nanostructures 2510. In yet another example, the non-uniformity of the one or more fill materials 2920 between the edges 2930 and the center 2940 is substantially less than 10%.

Figure 11A:
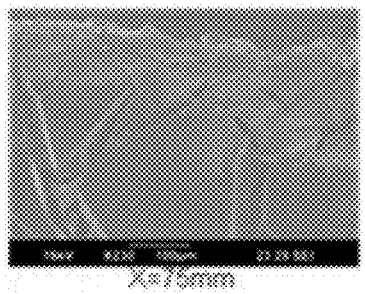
FIGS. 11A-11F are scanning electron microscope images showing various views of the array of nanostructures after the spin-on coating process as part of the method of FIG. 3 according to certain embodiments of the present invention.
Figure 11B:
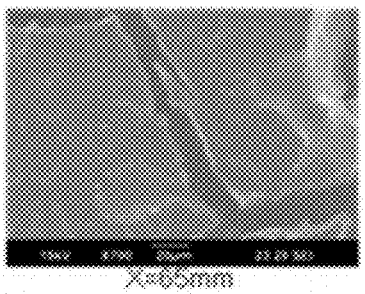
Figure 11C:
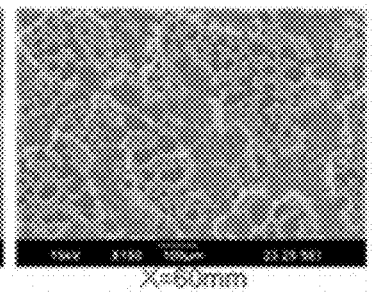
Figure 11D:
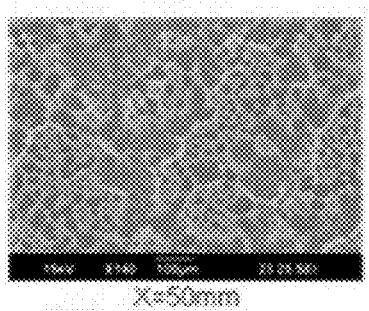
Figure 11E:
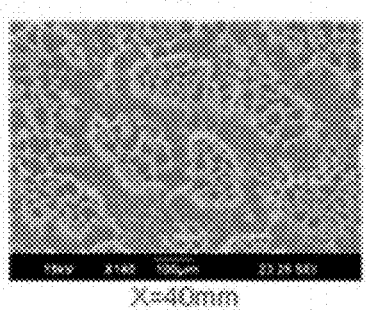
Figure 11F:
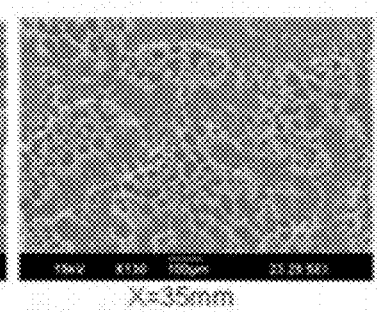

FIGS. 11A-11F are scanning electron microscope images showing various views of the array of nanostructures 2510 after the spin-on coating process as part of the method of FIG. 3 according to certain embodiments of the present invention. These images are merely examples, which should not unduly limit the scope of the claims. One of ordinary skill in the art would recognize many variations, alternatives, and modifications. As shown in FIGS. 11A-11F, the one or more fill materials 2920 cover the array of nanostructures 2510 in varying amounts based on the distance from the center 2940 of the array of nanostructures 2510. For example, as shown in FIGS. 11A and 11B, regions of the array of nanostructures 2510 with a distance of approximately 75 mm and 65 mm, respectively, from the center 2940 have a relative excessive coverage of the one or more fill materials. In another example, the first ends 2540 of the plurality of nanostructures 2530 at these distances from the center 2940 are hardly visible. In yet further examples, as shown in FIGS. 11C-11F, as the images move closer to the center 2940 of the array of nanostructures 2510, more of the first ends 2540 of the plurality of nanostructures 2530 become visible.

In another embodiment, the process 2340, to fill the array of nanostructures 2510 using the one or more fill materials includes a dipping process. For example, in the dipping process, the semiconductor substrate 2520 and the array of nanostructures 2510 is immersed in a bath of the one or more fill materials. In another example, the dipping process is aided by capillary force. In yet another embodiment, a sol-gel process is used to form long chains of the one or more oxides as the one or more fill materials.

In yet another embodiment, the process 2340, to fill the array of nanostructures 2510 using the one or more fill materials uses a deposition process. For example, the array of nanostructures is filled using chemical vapor deposition (CVD). In another example, the array of nanostructures is filled using atomic layer deposition (ALD). In yet another example, atomic layer deposition is used with TMOS (tetra-methyl-ortho-silicate), an oxidant, and/or a catalyst. In yet another example, TEOS (tetra-etho-ortho-silicate) is substituted for TMOS. In yet another example, silane ($SiH_4$) is substituted for TMOS. In yet another example, the oxidant includes water vapor and/or ozone. In yet another example, the catalyst includes an amine. In yet another example, the deposition processes are used to create a heterogeneous fill.

Figure 12:
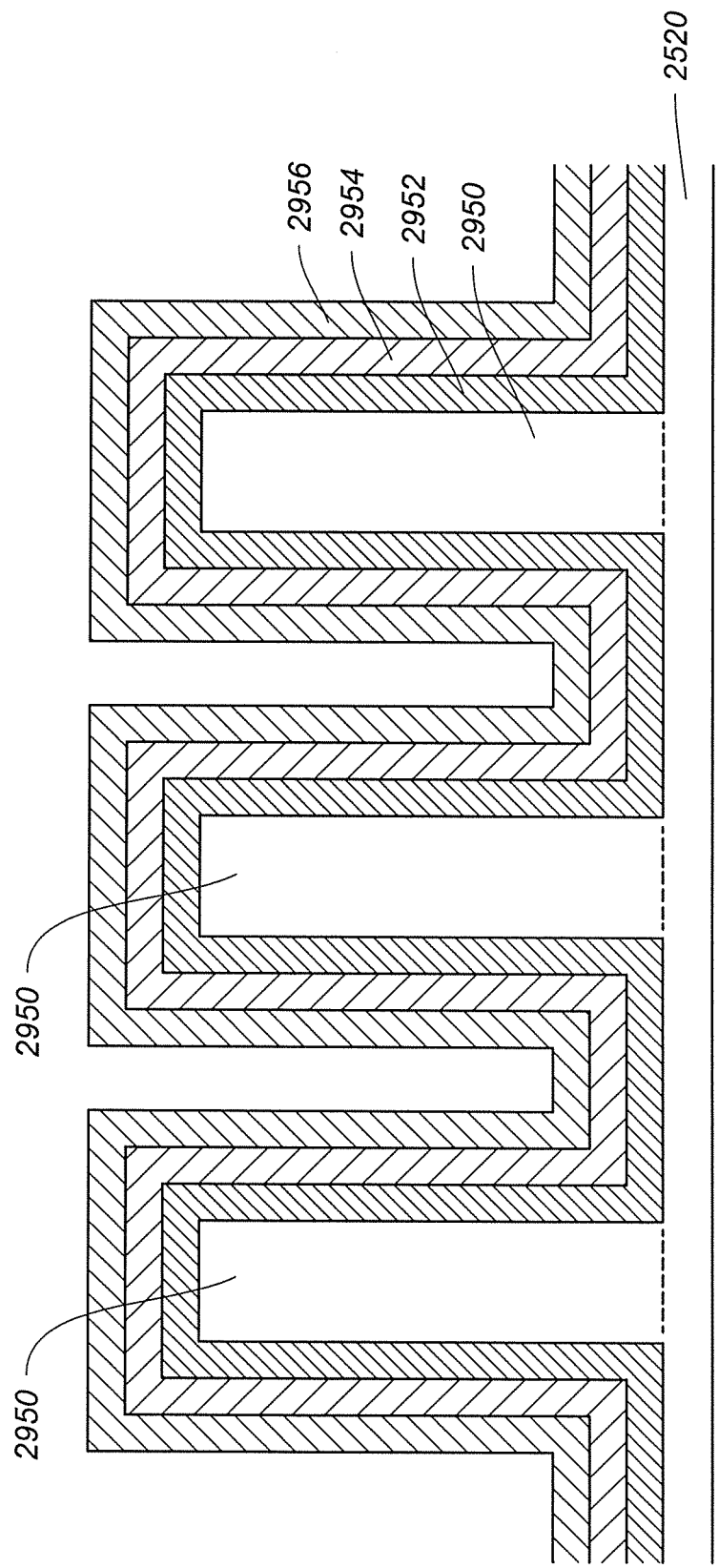
FIG. 12 is a simplified diagram showing a side view of the array of nanostructures during a deposition process used to fill the array of nanostructures as part of the method of FIG. 3 according to one embodiment of the present invention.

FIG. 12 is a simplified diagram showing a side view of the array of nanostructures 2510 during a deposition process used to fill the array of nanostructures 2510 as part of the method of FIG. 3 according to one embodiment of the present invention. This diagram is merely an example, which should not unduly limit the scope of the claims. One of ordinary skill in the art would recognize many variations, alternatives, and modifications. As shown in FIG. 12, one or more fill materials is distributed throughout the array of nanostructures 2510 in a layered fashion. For example, at least a first fill material is deposited in a first fill layer 2952 on the one or more surfaces of the plurality of nanostructures 2950. In another example, at least a second fill material is deposited in a second fill layer 2954 on the first fill layer 2952. In yet another example, at least a third fill material is deposited in a third fill layer 2956 on the second fill layer 2954. In yet another example, the first fill layer 2952, the second fill layer 2954, and/or the third fill layer 2956 form a conformal coating on the material in the layer below it. In yet another example, the first fill layer 2952 provides one or more surfaces with a hydrophobicity that is different from the underlying surfaces of the plurality nanostructures 2950. In yet another example, the first fill layer 2952 provides thermal protection to the underlying plurality of nanostructures 2950. In yet another example, the first fill material is SiN, TiN, BN, AlN, and/or CN, and the like. In yet another example, the second fill material and the third fill material are two dissimilar oxides. In yet another example, the second fill material is $SiO_2$ and/or $ZrO_2$. In yet another example, the third fill material is $ZrO_2$ and/or $SiO_2$.

As discussed above and further emphasized here, FIG. 12 is merely an example, which should not unduly limit the scope of the claims. One of ordinary skill in the art would recognize many variations, alternatives, and modifications. For example, nanostructures other than nanowires or nanoholes are formed. In another example, more than three layers of the one or more fill materials are used to fill the array of nanostructures. In yet another example, the at least second fill material and the at least third fill material are deposited in alternating layers until the array of nanostructures is substantially filled. In yet another example, different combinations of the one or more fill materials are used in different regions of the array of nanostructures. In yet another example, different combinations of the one or more fill materials having at least two distinct phases are used to fill the array of nanostructures.

Referring back to FIG. 3, at the optional process 2350 the one or more fill materials are cured. For example, the curing process includes transforming the one or more fill materials to solid form. In another example, the curing process 2350 includes thermally treating the one or more fill materials. In yet another example, the curing process 2350 is performed at about room temperature. In yet another example, the curing process 2350 is performed at an elevated temperature range up to a few hundred degrees Centigrade. In yet another example, the curing process 2350 is performed at about 500° C. In yet another example, the curing process 2350 is performed using a predetermined temperature profile. In yet another example, the curing process 2350 includes ramping up the temperature from about room temperature to between 50° C. and 250° C. over at a time period of up to about 2 hours. In yet another example, the curing process 2350 includes heat treating at an elevated temperature between 300° C. and 500° C. for a period of up to one hour. In yet another example, the curing process 2350 includes a cooling off period of up to 30 minutes or longer. In yet another example, the curing process 2350 cleans and/or drives impurities from the one or more fill materials. In yet another example, the curing process 2350 is performed in a furnace with a predetermined gaseous environment. In yet another example, the curing process 2350 is performed in a partial vacuum. In yet another example, the curing process 2350 is performed in a vacuum.

At the optional process 2360, the embedded array of nanostructures is planarized. For example, the planarization process 2360 includes polishing. In another example, the planarization process 2360 prepares the embedded array of nanostructures for further handling, machining, and/or manufacturing processes. In yet another example, the planarization process 2360 provides one or more surfaces on the embedded array of nanostructures that are configured to receive one or more conductive materials.

As discussed above and further emphasized here, FIGS. 3-12 are merely examples, which should not unduly limit the scope of the claims. One of ordinary skill in the art would recognize many variations, alternatives, and modifications. In some embodiments, nanostructures other than nanowires and nanoholes are formed and filled. For example, nanotubes, and/or nanomeshes are formed in the semiconductor substrate and then filled. In another example, the one or more fill materials form a porous matrix. In yet another example, the one or more fill materials form a matrix without cracks or voids. In yet another example, the one or more fill materials include one or more first fill materials and one or more second fill materials. In yet another example, the one or more first fill materials are used to fill a first portion of the array of nanostructures. In yet another example, the one or more second fill materials are used to fill a second portion of the array of nanostructures.

In some embodiments, a plurality of fill processes is used for the process 2340 for filling the array of nanostructures. For example, a deposition process is used to apply a conformal coating to the one or more surfaces of the one or more nanostructures. In another example, the conformal coating is used to alter the hydrophobicity of the one or more surfaces instead of using the process 2320 for pretreating the array of nanostructures.

According to one embodiment, a matrix with at least one embedded array of nanowires includes nanowires and one or more fill materials located between the nanowires. Each of the nanowires including a first end and a second end. The nanowires are substantially parallel to each other and are fixed in position relative to each other by the one or more fill materials. Each of the one or more fill materials is associated with a thermal conductivity less than 50 Watts per meter per degree Kelvin. And, the matrix is associated with at least a sublimation temperature and a melting temperature, the sublimation temperature and the melting temperature each being above 350° C. For example, the matrix is implemented according to at least FIG. 1.

In another example, the matrix is a part of a thermoelectric device. In yet another example, the matrix further includes a plurality of nanostructures, the plurality of nanostructures includes the one or more fill materials. In yet another example, a distance between the first end and the second end is at least 300 μm. In yet another example, the distance is at least 400 μm. In yet another example, the distance is at least 500 μm. In yet another example, the distance is at least 525 μm. In yet another example, the nanowires correspond to an area, the area being approximately 0.0001 mm² in size. In yet another example, the nanowires correspond to an area, the area being smaller than 0.01 mm² in size. In yet another example, the nanowires correspond to an area, the area being at least 100 mm² in size. In yet another example, the area is at least 1000 mm² in size. In yet another example, the area is at least 2500 mm² in size. In yet another example, the area is at least 5000 mm² in size.

In yet another example, the melting temperature and the sublimation temperature are each above 450° C. In yet another example, the melting temperature and the sublimation temperature are each above 550° C. In yet another example, the melting temperature and the sublimation temperature are each above 650° C. In yet another example, the melting temperature and the sublimation temperature are each above 750° C. In yet another example, the melting temperature and the sublimation temperature are each above 800° C. In yet another example, the thermal conductivity is less than 5 Watts per meter per degree Kelvin. In yet another example, the thermal conductivity is less than 1 Watts per meter per degree Kelvin. In yet another example, the thermal conductivity is less than 0.1 Watts per meter per degree Kelvin. In yet another example, the thermal conductivity is less than 0.01 Watts per meter per degree Kelvin. In yet another example, the thermal conductivity is less than 0.001 Watts per meter per degree Kelvin. In yet another example, the thermal conductivity is less than 0.0001 Watts per meter per degree Kelvin.

In yet another example, the one or more fill materials each include at least one selected from a group consisting of photoresist, spin-on glass, spin-on dopant, aerogel, xerogel, and oxide. In yet another example, the photoresist is G-line photoresist. In yet another example, the oxide is selected from a group consisting of $Al_2O_3$, FeO, $FeO_2$, $Fe_2O_3$, TiO, $TiO_2$, $ZrO_2$, ZnO, $HfO_2$, CrO, $Ta_2O_5$, SiN, TiN, BN, $SiO_2$, AlN, and CN. In yet another example, the one or more fill materials include one or more long chains of one or more oxides. In yet another example, the matrix is porous. In yet another example, surfaces of the nanowires are hydrophilic. In yet another example, surfaces of the nanowires are hydrophobic. In yet another example, at least one surface of the matrix is planarized.

In yet another example, the one or more fill materials are in different layers respectively. In yet another example, the different layers include a first layer, a second layer, and a third layer. The first layer includes one or more materials selected from a group consisting of SiN, TiN, BN, AlN, and CN. The second layer includes a first oxide. And, the third layer includes a second oxide. In yet another example, the first oxide is $SiO_2$ and the second oxide is $ZrO_2$. In yet another example, the first layer is on the nanowires, the second layer is on the first layer, and the third layer is on the second layer. In yet another example, the different layers further include a fourth layer and a fifth layer. The fourth layer includes the first oxide and the fifth layer includes the second oxide. In yet another example, the matrix includes a first region and a second region. The one or more fill materials include one or more first materials located in the first region and one or more second materials located in the second region. In yet another example, the nanowires include a semiconductor. In yet another example, the semiconductor is silicon.

According to another embodiment, a matrix with at least one embedded array of nanostructures includes nanostructures, the nanostructures include first ends and second ends respectively. The nanostructures corresponding to voids. One or more fill materials located at least within the voids. Each of the nanostructures includes a semiconductor material. The nanostructures are substantially parallel to each other and are fixed in position relative to each other by the one or more fill materials. Each of the one or more fill materials is associated with a thermal conductivity less than 50 Watts per meter per degree Kelvin. And, the matrix is associated with at least a sublimation temperature and a melting temperature, the sublimation temperature and the melting temperature each being above 350° C. For example, the matrix is implemented according to at least FIG. 2.

In another example, the nanostructures correspond to nanoholes and the nanoholes are the voids. In yet another example, the nanostructures correspond to nanowires and spaces surrounding the nanowires are the voids.

According to yet another embodiment, a method for making a matrix with at least one embedded array of nanostructures includes filling voids corresponding to nanostructures with at least one or more fill materials, each of the one or more fill materials being associated with a thermal conductivity less than 50 Watts per meter per degree Kelvin, the nanostructures including a semiconductor material and forming a matrix embedded with at least the nanostructures, the matrix being associated with at least a sublimation temperature and a melting temperature, the sublimation temperature and the melting temperature each being above 350° C. The process for filling the voids includes keeping the nanostructures substantially parallel to each other and fixing the nanostructures in position relative to each other by the one or more fill materials. For example, the matrix is implemented according to at least FIG. 3.

In another example, the method further includes forming the nanostructures including first ends and second ends respectively. In yet another example, the one or more fill materials each include at least one selected from a group consisting of photoresist, spin-on glass, spin-on dopant, aerogel, xerogel, and oxide. In yet another example, the method further includes pretreating one or more surfaces of the nanostructures. In yet another example, the process for pretreating includes altering the hydrophobicity of the one or more surfaces of the nanostructures. In yet another example, the method further includes preparing the one or more fill materials. In yet another example, the process for preparing the one or more fill materials includes doping the one or more fill materials.

In yet another example, the method further includes curing the one or more fill materials. In yet another example, the process for curing the one or more fill materials includes heating the one or more fill materials to at least 300° C. In yet another example, the process for curing the one or more fill materials includes heating the one or more fill materials to at least 500° C. In yet another example, the method further includes planarizing at least one surface of the matrix. In yet another example, the process for planarizing at least one surface of the matrix includes polishing the surface of the matrix.

In yet another example, the process for filling the voids includes applying the one or more fill materials in liquid form to the nanostructures and rotating the nanostructures to remove at least a portion of the one or more fill materials. In yet another example, the process for filling the voids includes dipping the nanostructures in the one or more fill materials. In yet another example, the process for filling the voids includes depositing the one or more fill materials. In yet another example, the process for depositing the one or more fill materials includes chemical vapor deposition. In yet another example, the process for depositing the one or more fill materials includes atomic layer deposition. In yet another example, the process for depositing the one or more fill materials includes using at least one selected from a group consisting of tetra-methyl-ortho-silicate (TMOS), tetra-etho-ortho-silicate (TEOS), and silane ($SiH_4$).

In yet another example, the process for depositing the one or more fill materials includes forming at least a conformal layer of the one or more fill materials. In yet another example, the process for depositing the one or more fill materials includes depositing the one or more fill materials in layers. In yet another example, the process for depositing the one or more fill materials includes depositing a first layer, the first layer including one or more materials selected from a group consisting of SiN, TiN, BN, MN, and CN, depositing a second layer, the second layer including a first oxide, and depositing a third layer, the third layer including a second oxide. In yet another example, the first oxide is $SiO_2$ and the second oxide is $ZrO_2$. In yet another example, the process for depositing the first layer includes depositing the first layer on surfaces of the nanostructures, the process for depositing the second layer includes depositing the second layer on the first layer, and the process for depositing the third layer includes depositing the third layer on the second layer. In yet another example, the process for depositing the one or more fill materials further includes depositing a fourth layer, the fourth layer including the first oxide and depositing a fifth layer, the fifth layer including the second oxide. In yet another example, the one or more fill materials includes one or more first materials and one or more second materials. The voids include a first plurality of voids and a second plurality of voids. The process for filling the voids includes filling the first plurality of voids with the one or more first materials and filling second plurality of voids with the one or more second materials.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A matrix with at least one embedded array of nanowires, the matrix comprising:
   nanowires, each of the nanowires including a first end and a second end; and
   one or more fill materials located between the nanowires;
   wherein:
   the nanowires are substantially parallel to each other and are fixed in position relative to each other by the one or more fill materials;
   each of the one or more fill materials is associated with a thermal conductivity less than 50 Watts per meter per degree Kelvin; and
   the matrix is associated with at least a sublimation temperature and a melting temperature, the sublimation temperature and the melting temperature each being above 350° C.

2. The matrix of claim 1 wherein the matrix is a part of a thermoelectric device.

3. The matrix of claim 1, and further comprising a plurality of nanostructures including the one or more fill materials.

4. The matrix of claim 1 wherein a distance between the first end and the second end is at least 300 µm.

5. The matrix of claim 4 wherein the distance is at least 400 µm.

6. The matrix of claim 5 wherein the distance is at least 500 µm.

7. The matrix of claim 6 wherein the distance is at least 525 µm.

8. The matrix of claim 1 wherein the nanowires correspond to an area, the area being approximately 0.0001 mm$^2$ in size.

9. The matrix of claim 1 wherein the nanowires correspond to an area, the area being smaller than 0.01 mm$^2$ in size.

10. The matrix of claim 1 wherein the nanowires correspond to an area, the area being at least 100 mm$^2$ in size.

11. The matrix of claim 10 wherein the area is at least 1000 mm$^2$ in size.

12. The matrix of claim 11 wherein the area is at least 2500 mm$^2$ in size.

13. The matrix of claim 12 wherein the area is at least 5000 mm$^2$ in size.

14. The matrix of claim 1 wherein the melting temperature and the sublimation temperature are each above 450° C.

15. The matrix of claim 14 wherein the melting temperature and the sublimation temperature are each above 550° C.

16. The matrix of claim 15 wherein the melting temperature and the sublimation temperature are each above 650° C.

17. The matrix of claim 16 wherein the melting temperature and the sublimation temperature are each above 750° C.

18. The matrix of claim 17 wherein the melting temperature and the sublimation temperature are each above 800° C.

19. The matrix of claim 1 wherein the thermal conductivity is less than 5 Watts per meter per degree Kelvin.

20. The matrix of claim 19 wherein the thermal conductivity is less than 1 Watt per meter per degree Kelvin.

21. The matrix of claim 20 wherein the thermal conductivity is less than 0.1 Watts per meter per degree Kelvin.

22. The matrix of claim 21 wherein the thermal conductivity is less than 0.01 Watts per meter per degree Kelvin.

23. The matrix of claim 22 wherein the thermal conductivity is less than 0.001 Watts per meter per degree Kelvin.

24. The matrix of claim 21 wherein the thermal conductivity is less than 0.0001 Watts per meter per degree Kelvin.

25. The matrix of claim 1 wherein the one or more fill materials each include at least one selected from a group consisting of photoresist, spin-on glass, spin-on dopant, aerogel, xerogel, and oxide.

26. The matrix of claim 25 wherein the photoresist is G-line photoresist.

27. The matrix of claim 1 wherein the one or more fill materials include one or more long chains of one or more oxides.

28. The matrix of claim 1 wherein the matrix is porous.

29. The matrix of claim 1 wherein surfaces of the nanowires are hydrophilic.

30. The matrix of claim 1 wherein surfaces of the nanowires are hydrophobic.

31. The matrix of claim 1 wherein at least one surface of the matrix is planarized.

32. The matrix of claim 1 wherein the one or more fill materials are in different layers respectively.

33. The matrix of claim 32 wherein:
the different layers include a first layer, a second layer, and a third layer;
the first layer includes one or more materials selected from a group consisting of SiN, TiN, BN, AlN, and CN;
the second layer includes a first oxide; and
the third layer includes a second oxide.

34. The matrix of claim 33 wherein the first oxide is SiO$_2$ and the second oxide is ZrO$_2$.

35. The matrix of claim 33 wherein:
the first layer is on the nanowires;
the second layer is on the first layer; and
the third layer is on the second layer.

36. The matrix of claim 33 wherein:
the different layers further include a fourth layer and a fifth layer;
the fourth layer includes the first oxide; and
the fifth layer includes the second oxide.

37. The matrix of claim 1 wherein:
the matrix includes a first region and a second region; and
the one or more fill materials include one or more first materials located in the first region and one or more second materials located in the second region.

38. The matrix of claim 1 wherein the nanowires include a semiconductor.

39. The matrix of claim 38 wherein the semiconductor is silicon.

40. A matrix with at least one embedded array of nanostructures, the matrix comprising:
nanostructures including first ends and second ends respectively, the nanostructures corresponding to voids; and
one or more fill materials located at least within the voids;
wherein:
each of the nanostructures includes a semiconductor material;
the nanostructures are substantially parallel to each other and are fixed in position relative to each other by the one or more fill materials;
each of the one or more fill materials is associated with a thermal conductivity less than 50 Watts per meter per degree Kelvin; and
the matrix is associated with at least a sublimation temperature and a melting temperature, the sublimation temperature and the melting temperature each being above 350° C.

41. The matrix of claim 40 wherein:
the nanostructures correspond to nanoholes; and
the nanoholes are the voids.

* * * * *